(12) United States Patent
Nonaka

(10) Patent No.: US 8,638,280 B2
(45) Date of Patent: Jan. 28, 2014

(54) NON-RECTANGULAR DISPLAY APPARATUS

(75) Inventor: Yoshihiro Nonaka, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 878 days.

(21) Appl. No.: 12/109,424

(22) Filed: Apr. 25, 2008

(65) Prior Publication Data

US 2008/0266210 A1  Oct. 30, 2008

(30) Foreign Application Priority Data

Apr. 27, 2007 (JP) ................................. 2007-118912
Apr. 16, 2008 (JP) ................................. 2008-106654

(51) Int. Cl.
G09G 3/36 (2006.01)

(52) U.S. Cl.
USPC .............................................. 345/87; 345/76

(58) Field of Classification Search
USPC ......................................... 345/87; 349/41–42
See application file for complete search history.

(56) References Cited

U.S. PATENT DOCUMENTS

| | | | |
|---|---|---|---|
| 6,295,046 B1 | 9/2001 | Hebiguchi | |
| 7,253,865 B2 | 8/2007 | Battersby | |
| 2001/0007448 A1* | 7/2001 | Kobayashi et al. | 345/100 |
| 2005/0225690 A1* | 10/2005 | Battersby | 349/41 |

FOREIGN PATENT DOCUMENTS

| | | |
|---|---|---|
| CN | 1763591 A | 4/2006 |
| JP | 2000-246447 A | 9/2000 |
| JP | 2004-111428 A | 4/2004 |
| JP | 2004-347474 A | 12/2004 |
| JP | 2005-528644 A | 9/2005 |
| JP | 2005529368 A | 9/2005 |
| JP | 2005-311823 A | 11/2005 |
| JP | 2009122636 A | 6/2009 |
| WO | 93/04460 A1 | 3/1993 |

OTHER PUBLICATIONS

Japanese Office Action dated Jun. 19, 2012 issued in counterpart Japanese Patent Application No. 2008-106654.
Chinese Office Action dated Oct. 31, 2012 in counterpart Chinese Patent Application No. 2008-10092390.4.

* cited by examiner

*Primary Examiner* — Kevin M Nguyen
*Assistant Examiner* — Cory Almeida
(74) *Attorney, Agent, or Firm* — Sughrue Mion, PLLC

(57) ABSTRACT

Disclosed is a display apparatus comprising an active matrix display section including a plurality of signal lines and scan lines, arranged in a matrix on a substrate, and a plurality of pixels and active elements arranged at intersections of the signal and scan lines, a scan line driving circuit for driving the scan lines and a signal line driving circuit for driving the signal lines. The display section has a non-rectangular shape. The active elements that make up the scan line driving circuit and/or the signal line driving circuit are formed by the same manufacturing process as that for forming the active elements in the active matrix display section. The scan line driving circuit and/or the signal line driving circuit are each a set of circuit units having the same function. These circuit units are arranged to conform to and extend around the outer circumference of the non-rectangular display section.

16 Claims, 30 Drawing Sheets
(24 of 30 Drawing Sheet(s) Filed in Color)

REFERENCE CASE

REFERENCE CASE

REFERENCE CASE

NON-RECTANGULAR DISPLAY APPARATUS

REFERENCE TO RELATED APPLICATION

The present application is claiming the priority of the earlier Japanese patent applications No. 2007-118912 filed on Apr. 27, 2007 and No. 2008-106654 filed on Apr. 16, 2008, the entire disclosure thereof being incorporated herein by reference thereto.

FIELD OF THE INVENTION

This invention relates a display apparatus having a non-rectangular display section.

BACKGROUND OF THE INVENTION

FIG. 24 is a diagram schematically illustrating a typical configuration of a conventional active matrix display apparatus. Referring to FIG. 24, a pixel and an active element, such as a thin-film transistor, are provided at an intersection of a signal line and a data line arranged in a matrix pattern relative to each other. During the time a selection pulse is supplied to a scan line, the active element, the gate terminal of which is connected to the scan line, is in an on-state. Hence, the signal potential, charged to the signal line, is applied to a pixel, such as a liquid crystal cell. This potential causes an optical property of a liquid crystal material to be changed to change a display.

In general practice, a display section 1 of a conventional active matrix display apparatus is rectangular in shape. A scan line driving circuit 8 for applying a scan voltage to a scan line 2 and a signal line driving circuit 9 for applying a signal voltage to a signal line 3 are arranged respectively on neighboring sides of the rectangular display section 1.

In this manner, such a display apparatus of a narrow frame edge width may be implemented in which the distance between the rim of a display substrate 10 and the rim of the display section 1 is small even for a high-definition display having larger numbers of scan lines 2 and signal lines 3.

In case the field of application of the active matrix display apparatus, capable of high definition display, is enlarged, there are cases where not the customary rectangular shape but a non-rectangular shape, such as a circular or a semi-circular shape, is more desirable as the display shape.

For example, a timepiece shown in FIG. 21 can be switched between analog demonstration and the digital demonstration. If the demonstration by an analog timepiece is to be made much of, the display is preferably circular in shape.

In the case of a speedometer, mounted on an automotive vehicle, shown in FIG. 23, a semi-circular shape is preferred.

As a display apparatus, having a non-rectangular display section, there is shown in Patent Document 1 (WO93/04460A1) such a display apparatus having a circular display section, which herein is shown in FIG. 25. In Patent Document 1, two scan line driving circuits 8 and two signal line driving circuits 9, as rectangular semiconductor ICs, respectively driving the scan lines and the signal lines of the circular display section, are arranged at four places, more precisely, at four corners of a rectangular substrate, around the rim of the display section 1.

If, in a timepiece with an analog dial plate, having a rectangular display section 1, as an example, the shape of the display substrate 10 is also circular, similar to the shape of the display section 1, several advantages may be derived.

That is, if the display apparatus is of a narrow frame edge width, in which the rim of the display substrate 10 is close to the rim of the display section 1, the display section 1 may be larger in size. On the other hand, no wasteful mounting space is taken up when the display apparatus is built into a different apparatus, such as a mobile phone, as shown in FIG. 22.

If, in FIG. 25, the semiconductor IC of the scan line driving circuit 8 and that of the signal line driving circuit 9 are extremely small in size as compared to the display section 1, the size and the shape of the display substrate 10 may be proximate to those of the display section 1.

On the other hand, if the driving circuit is not small in size, that is, if the outer circumference of the driving circuit is approximately as large as that of the display section 1, the size and the shape of the display substrate 10 are limited by those of the driving circuit.

Hence, the non-rectangular display apparatus of a narrow frame edge width is difficult to implement.

In Patent Document 2 (JP Patent Kohyo Publication No. JP-P2005-528644A), there is disclosed a configuration in which a plurality of scan line driving circuits and a plurality of signal line driving circuits are alternately arrayed around a non-rectangular display section.

However, in the configurations disclosed in these Patent Documents 1 and 2, the driving circuit is shown by a rectangle, with the radius of curvature of the rim part being small. The problem similar to that referred to above becomes serious in case the driving circuit is arrayed in proximity to the circular rim.

In Patent Document 3 (JP Patent Kokai Publication No. JP-P2005-311823A), there is disclosed a configuration comprising a semicircular base substrate on which a sector-shaped IC chip is mounted as a driving circuit.

In general, an IC chip is sliced as a chip segment from a silicon wafer using a dicing equipment fitted with a dicing saw. The chip sliced out is rectangular in shape because the silicon wafer or the dicing saw is moved rectilinearly.

Among the techniques so far proposed for slicing out the chip to an arbitrary shape, there are laser dicing disclosed in Patent Document 4 (JP Patent Kokai Publication No. JP-P2000-246447A) and a dicing method in which rotation is applied to stage and wafer movements (JP Patent Kokai Publication No. JP-P2004-111428A). Both of these techniques are in need of a dedicated special dicing equipment.

In a mobile navigation device, disclosed in Patent Document 6 (JP Patent Kokai Publication No. JP-P2004-347474A), there is disclosed arranging circuits with high density in an area analogous in shape with the curvature of the outer circumference of the display panel and which is radially extended from the end of the display panel to the end of the substrate.

In case the display panel is circular, the aforementioned area is sector-shaped. This related art example shows arranging a liquid crystal driving circuit in an area extending around the rim of the display panel, and forming a liquid crystal driving circuit and a liquid crystal panel by thin-film transistors on a glass substrate.

However, no reference has been made to the position relationship between the gate lines and the data lines that make up the liquid crystal panel and the liquid crystal driving circuit that drives the gate and data lines. That is, there lacks the disclosure as to specified means for implementing high density mounting of the liquid crystal driving circuit.

[Patent Document 1] WO93/004460A1
[Patent Document 2] JP Patent Kohyo Publication No. JP-P2005-528644A
[Patent Document 3] JP Patent Kokai Publication No. JP-P2005-311823A

[Patent Document 4] JP Patent Kokai Publication No. JP-P2000-246447A

[Patent Document 5] JP Patent Kokai Publication No. JP-P2004-111428A

[Patent Document 6] JP Patent Kokai Publication No. JP-P2004-347474A

The following analysis of the related arts is given by the present invention. The entire disclosures of the above mentioned Patent Documents are herein incorporated by reference thereto. In a conventional non-rectangular display apparatus, the display section is of an arbitrary shape, whilst the apparatus and the substrate are customarily rectangular in shape.

In case the substrate is made analogous in shape with the non-rectangular display section, it is possible to realize a display apparatus of a narrow frame edge width in which the rim of the display section is proximate to the rim of the substrate.

However, in such case, driving circuits, typified by a scan line driving circuit and signal line driving circuit, pose a problem. A rectangular driving circuit, such as a semiconductor IC mounted on a substrate of a display apparatus, as disclosed in Patent Document 1 (WO93/004460A1), for example, the substrate has corners, and hence the apparatus cannot afford a narrow frame edge width.

To produce a display apparatus with a narrow frame edge width, using an IC chip, shaped to conform to the semicircular base substrate, such as the display apparatus disclosed in Patent Document 7, it is necessary to use such a special dicing equipment as disclosed in Patent Documents 4 and 5.

SUMMARY OF THE DISCLOSURE

Accordingly, it is an object of the present invention to provide a display apparatus having a non-rectangular display surface in which driving circuits may be arranged with high density, the substrate and the apparatus are non-rectangular in shape and in which the apparatus is of a narrow frame edge width.

The above and other objects may be attained by the invention summarized substantially as follows:

According to one aspect of the present invention, there is provided a display apparatus comprising:

an active matrix display section including: a plurality of signal lines and a plurality of scan lines, arrayed in a matrix form on a substrate; and a plurality of active elements and pixels, arranged at intersections of the signal lines and the scan lines;

a scan line driving circuit for driving the scan lines, and a signal line driving circuit for driving the signal lines. The display section has a non-rectangular shape. At least one of the scan line driving circuit and the signal line driving circuit includes a plurality of active elements having the same configuration as active elements in the active matrix. At least one of the scan line driving circuit and the signal line driving circuit includes a plurality of circuit units having the same function. The circuit units are arranged along the outer circumference of the non-rectangular display section.

According to the present invention, it is possible to implement a display apparatus of a narrow frame edge width in which the apparatus has a non-rectangular shape analogous with the shape of the non-rectangular display surface. The reason is that, since each driving circuit is split into circuit units of a common small size, and the circuit arraying positions and angles are set from one such circuit unit to another, it is possible to array the driving circuit to high density at the positions more proximate to the non-rectangular display section, even though the circuit units of the common small size are used. Moreover, the scan line driving circuit and the signal line driving circuit, shaped to conform to and extend along the outer circumference of the display section, are composed by active elements of the same configuration as active elements that make up the display section, the same manufacturing equipment or process may be used to produce the active elements for driving circuits and those for the active matrix. That is, the same manufacturing equipment and process may be co-used in manufacturing the two sorts of active elements.

According to another aspect of the present invention, the scan line driving circuit and the signal line driving circuit each include a set of circuit unit blocks each composed of plural stages of connected rectangular or non-rectangular circuit block units. The intervals between the circuit unit blocks are changed.

According to the present invention, it is possible to implement a display apparatus with an adjustable delay time of signals driving the scan line driving circuit or the signal line driving circuit. The reason is that, with the variable intervals between the neighboring circuit unit blocks, the lengths of the driving signal lines interconnecting the respective units, that is, the signal delay time, may be determined from one set of the circuit unit blocks to the next.

With the display apparatus of the third aspect of the present invention, one of the scan line driving circuit and the signal line driving circuit, lying adjacent to a rectilinear rim part of the non-rectangular display section, is a semiconductor IC having a rectangular shape. The driving circuit lying adjacent to a curvilinear rim part of the non-rectangular display section, neighboring to the aforementioned rectilinear rim part, has a non-rectangular shape conforming to and lying along the curvilinear rim part, and is constituted by the aforementioned active elements.

According to the present invention, the non-rectangular display apparatus, having a rectilinear side, may be of a narrower frame edge width. The reason is that the semiconductor IC is smaller in size than the driving circuit constituted using thin-film transistors as the active elements, and that, as long as the rectangular semiconductor IC driving circuit is mounted adjacent to the rectilinear side, the substrate shape is not restricted by the size of the driving circuit.

With the display apparatus according to the fourth aspect of the present invention, the length of the outer circumference part of the display section, lying adjacent to the signal line driving circuit, is longer than the length thereof lying adjacent to the scan line driving circuit.

According to the present invention, it is possible to construct a display apparatus of a narrower frame edge width having a non-rectangular shape analogous with the non-rectangular display surface. It is because the signal line driving circuit may be laid out to a narrower width by elongating the signal line driving circuit having a larger number of active elements that make up the circuit and thus having a larger circuit size.

According to the fifth aspect of the present invention, the layout size of the circuit unit of the scan line driving circuit or the signal line driving circuit is smaller than an area enclosed by two neighboring ones of the scan lines and by two neighboring ones of the signal lines.

According to the present invention, it is possible to reduce the interference between the scan lines or between the signal lines. The reason is that the active matrix may be connected to the scan line driving circuit or to the signal line driving circuit by bending the scan line or the signal line without changing the relative distance therebetween.

The meritorious effects of the present invention are summarized as follows.

According to the present invention, driving circuits may be arranged with higher density in a display apparatus having a non-rectangular display surface, so that it is possible to produce a display apparatus of a narrow frame edge width from a substrate and apparatus both of which are non-rectangular in shape.

The reason is that the driving circuit arranged adjacent to the display section are arrayed along the outer circumference of the non-rectangular display section, from one group of circuit units having the common function to another. This enables the non-rectangular driving circuits to be laid out to higher density to provide for a narrow frame edge width of the display apparatus with the shape and the size of the substrate of the apparatus proximate to those of the display section.

According to the present invention, there is no necessity of using a special dicing equipment to slice out the non-rectangular driving circuit or adding a special process to produce the non-rectangular display apparatus with a narrow frame edge width. The reason is that, since the active elements constituting the driving circuit are produced on the same substrate and using the same process to produce the active elements of the active matrix, it is possible to co-use the manufacturing equipment and the process for manufacturing the driving circuit.

BRIEF DESCRIPTIONS OF THE DRAWINGS

The patent or application file contains at least one drawing executed in color. Copies of this patent or patent application publication with color drawings will be provided by the U.S. patent and Trademark Office upon request and payment of the necessary fee.

PREFERRED MODES OF THE INVENTION

Figure 1:
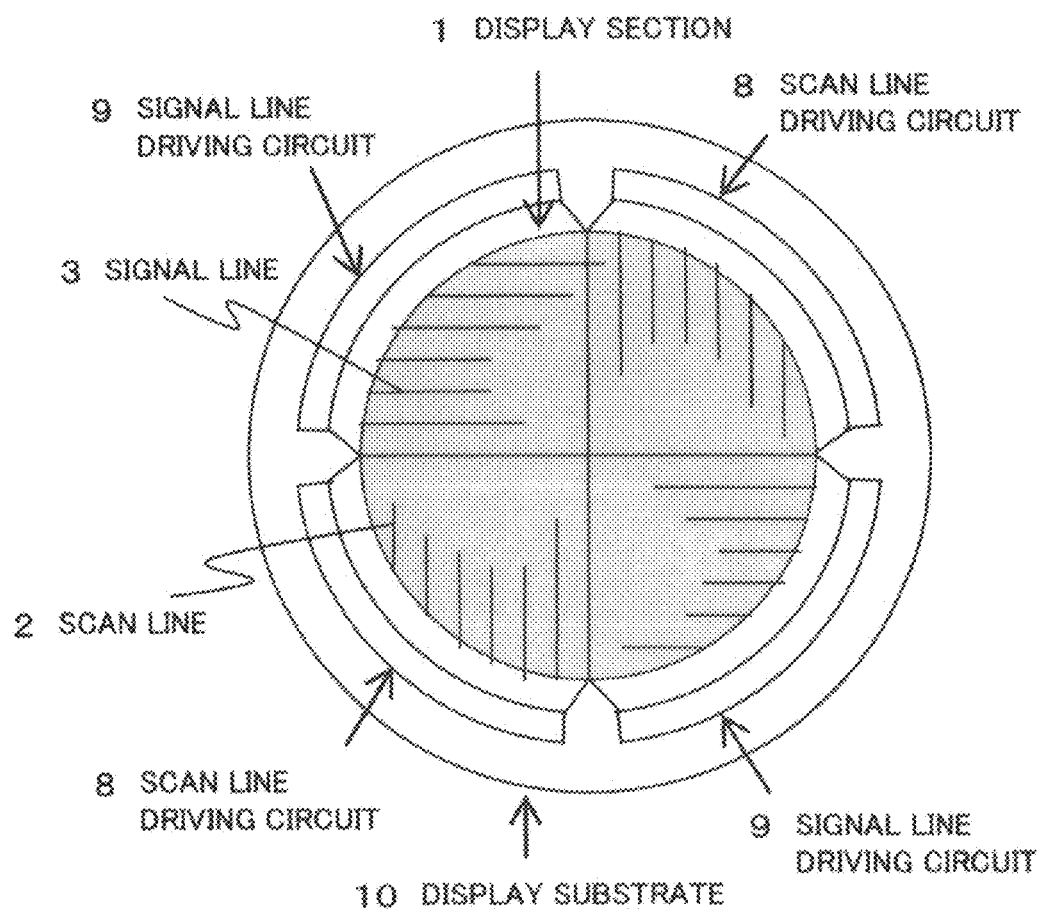
FIG. 1 is a plan view showing a configuration of a first exemplary embodiment of the present invention.

Referring to the drawings, exemplary embodiments of the present invention will be described in detail.

First Exemplary Embodiment

FIG. 1 is a plan view showing the configuration of an exemplary embodiment of the present invention. The present exemplary embodiment is directed to a non-rectangular display apparatus having a circular-shaped display section 1. The display apparatus of the present exemplary embodiment includes an active matrix display section 1, two scan line driving circuits 8 and two signal line driving circuits 9, each being formed on a display substrate 10. The active matrix display section 1 includes a plurality of scan lines 2, a plurality of signal lines 3, and a plurality of pixels and active elements formed of thin-film transistors, arranged at the intersections of the scanning and signal lines. The scan line driving circuit 8 is formed by thin-film transistors, and the signal line driving circuit 9 is formed by thin-film transistors.

By having both the scan line driving circuits 8 and the signal line driving circuits 9 formed to a planar sector shape of a curvature that conforms to the shape of the outer circumference of the display section 1, the shape of the display substrate 10 may be similar to the shape of the non-rectangular display section 1, thereby realizing a display apparatus of a narrow frame edge width, in which the size of the display section 1 is close to that of the display substrate 10.

The present invention provides a configuration in which the driving circuits of the active matrix may be laid out with high density in a non-rectangular area, such as a sector area.

In displaying the active matrix, the thin-film transistors 4, the gate terminals of which are connected to the scan lines 2, are rendered conductive by sequentially changing the voltage applied to the scan lines 2. During the period when the thin-film transistor 4 is conductive, the voltage corresponding to video data is applied to the pixel via the signal line 3, thereby charging the pixel.

The scan line driving circuit 8 is equipped with the function of sequentially driving the scan lines 20. This function can be implemented by a plurality of stages of shift register circuits 100.

Figure 4:
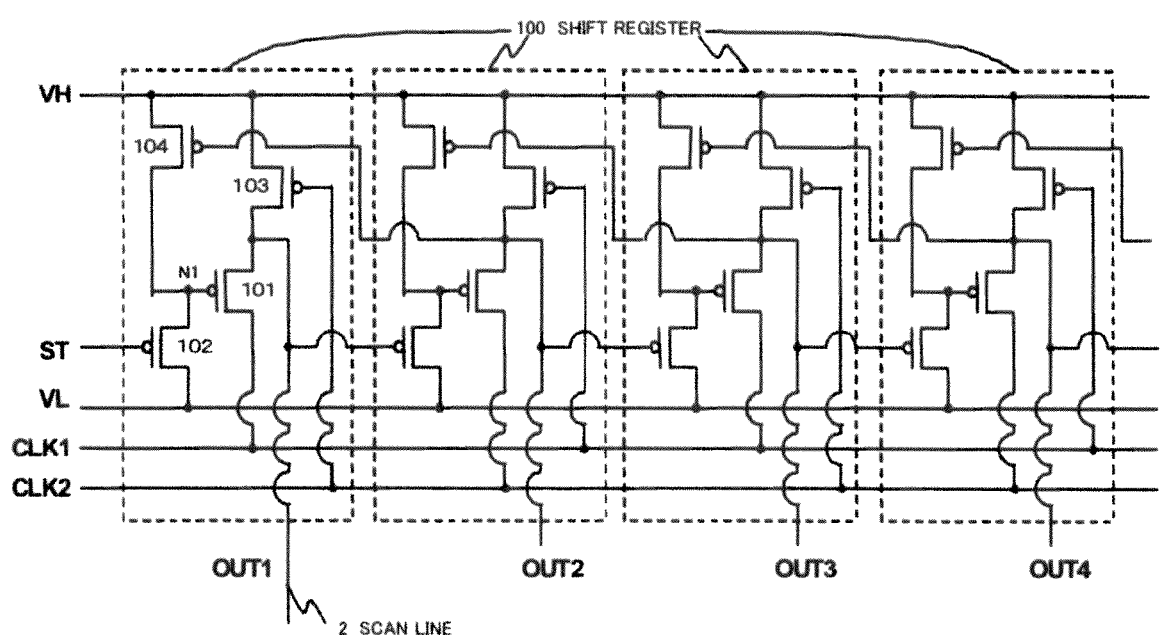
FIG. 4 is a circuit diagram showing the configuration of a scan line driving circuit made up by shift registers.

FIG. 4 shows an example of a circuit configuration of a scan line driving circuit constituted by shift registers. Referring to FIG. 4, each shift register includes P-type transistors 104, 102, 103 and 101. The transistor 104 connects a power supply VH and a node N1, the transistor 102 connects the node N1 and a power supply VL, the transistor 103 connects the power supply VH and an output OUT1, and the transistor 101 connects the output OUT1 and a clock CLK1.

The transistor 101 has a gate connected to the node N1. The transistor 102 has a gate connected to an output of the shift register of the previous stage. In case the first-stated shift register is the first stage shift register, a start signal ST is supplied to the gate of the transistor 102. The transistor 103 has a gate supplied with a clock CLK2. The transistor 104 has a gate connected to an output OUT2 of the next stage shift register.

The clocks CLK1 and CLK2 are complementary to each other. In case the shift register shown is of an odd stage, the clocks are connected as described above. However, in case shift register shown is of an even stage, the clocks CLK1 and CLK2 are interchanged, that is, the clock CLK2 is connected to the transistor 101 and the clock CLK1 is connected to the gate of the transistor 104.

Figure 5:
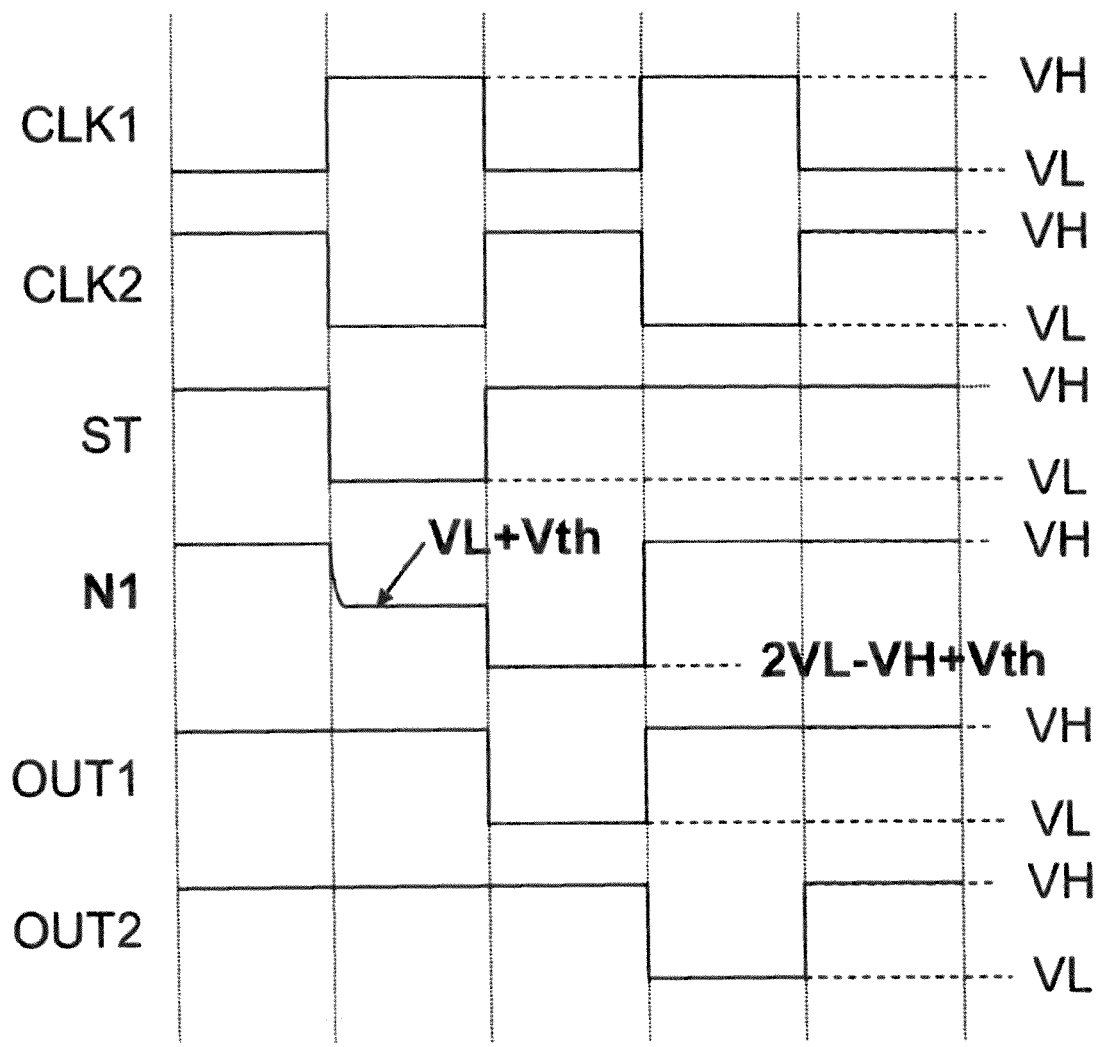
FIG. 5 is a timing diagram showing the operation of a scan line driving circuit.

FIG. 5 is a timing chart for illustrating the operation of the shift register of FIG. 4. When the start signal ST changes from a high level VH to the low level VL, the transistor 102 is turned on, so that the potential at the node N1 is lowered to approximately VL+Vth, where VTh is a threshold voltage of the transistor 102.

This causes the transistor 101 to be turned on. However, since the CLK1 is at the high level VH, the output OUT1 is at the high level VH.

When the clock CLK1 changes from the high level VH to the low level VL, and the clock CLK2 changes from the low level VL to the high level VH, the output OUT1 changes from the high level VH to the low level VL, with the transistor 101 in an ON state, under the bootstrap effect of the transistor 101. At this time, CLK2, which is supplied to the gate of the transistor 103, is at the high level VH, thus setting the transistor 103 in an OFF state.

When next the clock CLK1 changes from the low level VL to the high level VH, and the clock CLK2 changes from the high level VH to the low level VL, the transistor 103 is turned ON so that the output OUT1 changes to the high level VH.

Even if the transistor 101 is kept ON at this time, no short circuit current flows from VH to CLK1, since CLK1 is at the high level VH.

If the output OUT2 of the second stage shift register, connected to the gate of the transistor 104, is at the low level VL, the transistor 104 is turned ON. Hence, the node N1 transfers to the high level VH to turn the transistor 101 OFF.

By sequentially repeating the above operations, the output terminals OUT1, OUT2, OUT3 and so forth of the respective shift registers generate pulses at the low level VL synchronized with the clocks CLK1 and CLK2.

By connecting these output terminals to the scan lines 2 of the active matrix, either directly or via a buffer circuit, it is possible to implement the function of the scan line driving circuit for sequentially driving the scan lines.

In the above-described exemplary embodiment, the transistors used are of P-type. However, N-type transistors may also be used to construct a similar shift register circuit. Moreover, both N-type and P-type transistors may be used to construct a complementary shift register circuit having a comparable function.

In the foregoing, the scan line driving circuit 8, driving the scan lines 2, has been described. However, the signal line driving circuit 9, adapted to apply a desired signal voltage to the signal lines 3 of the active matrix, has a certain feature in common with the scan line driving circuit 8. This common feature is that the signal line driving circuit 9, adapted to drive the signal lines of the active matrix, in its entirety, includes a plurality of circuits each having the same function in terms of one or more signal lines 3 as a unit.

That is, by grouping one or more scan lines 2 and one or more signal lines 3 together as circuit blocks, and by employing a plurality of the same circuit blocks each for the scan lines and the signal lines, it is possible to construct the scan line driving circuits 8 and the signal line driving circuit 9 driving the active matrix in its entirety.

In many cases, the same circuit layout pattern is used for the internal configurations of the circuit blocks having the same function. For example, regarding the driving circuits, the scan line driving circuit, shown in FIG. 4, includes a plurality of connected shift register circuits 100, each of which is associated with an associated scan line. In this case, the shift register circuit 100 may be represented as shown in FIG. 2, in which an n-th scan line is connected to an output OUTn of the n-th shift register.

Figure 2:
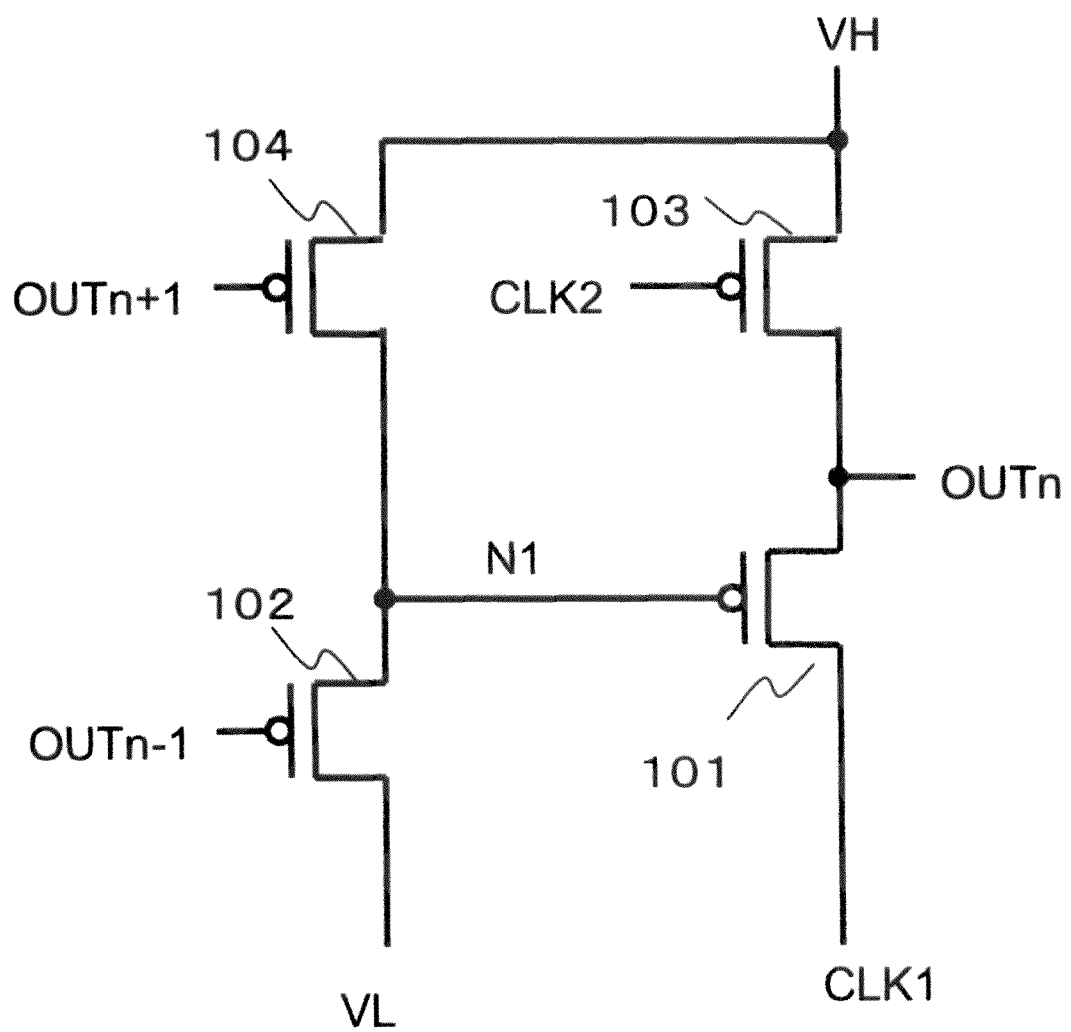
FIG. 2 is a circuit diagram showing an example of a shift register.

In FIG. 2, OUTn−1 and OUTn+1 denote outputs of the (n−1)-th shift register and the (n+1)-th shift register, respectively, and are delivered to an n-th shift register. VH and VL denote a high potential power supply and a low potential power supply, respectively. The clock signals CLK1 and CLK2 are reversed in phase each other.

Figure 3:
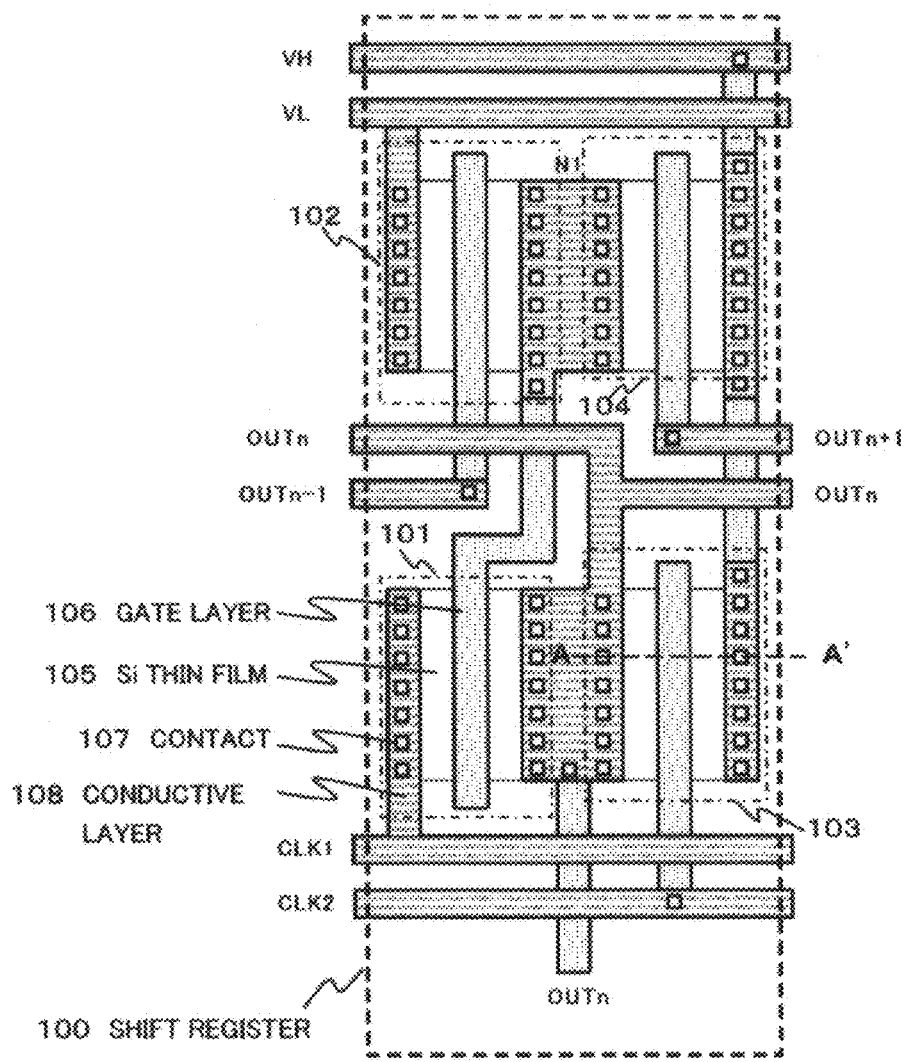
FIG. 3 is a schematic view showing an example of the layout of the shift register.

FIG. 3 shows an example of a layout of a circuit layout that functions as the shift register 100 shown in FIG. 2. A silicon thin film 105 is a poly-silicon thin film, for instance.

Figure 31:
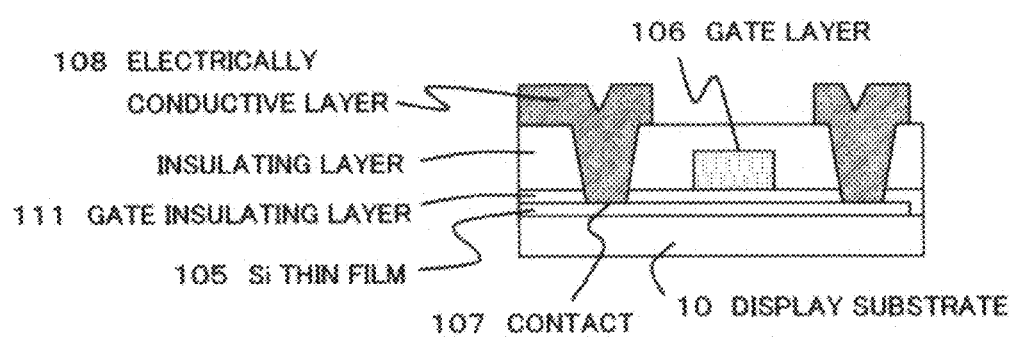
FIG. 31 is a partial cross-sectional view showing the configuration of a thin-film transistor.

FIG. 31 shows a cross-sectional view along line A-A' of FIG. 3, in order to clarify the layer configuration of a thin film transistor. The thin film transistor is composed of a gate formed by a gate layer 106, spaced apart a distance corresponding to thickness of a gate insulating film 111 from a silicon thin film 105, and a source and a drain, formed by reducing the resistance in certain portions of the silicon thin film 105. The thin-film transistor 101, forming the circuit, and the thin-film transistor 104, forming the pixel, may have the same layer structure, and may be manufactured to the same thickness by the same process using the same equipment.

The gate layer 106, constituting the gate of the transistor, is also used as an interconnect because of its electrical conductivity. A conductive layer 108 is formed of metal, such as aluminum, and is used as a conductor.

A contact 107 is used for establishing electrical connection between the source or the drain, formed by partially reducing the resistance of the silicon thin film 105, or the gate layer 106, and the conductive layer 108.

In laying out the scan line driving circuit 8 to a rectangular shape, it is sufficient that the shift register 100 of FIG. 3 is repeatedly translated and duplicated along the transverse direction.

It should be noticed that the clock signals CLK1 and CLK2 are interchanged alternately between neighboring shift registers 100.

Figure 6:
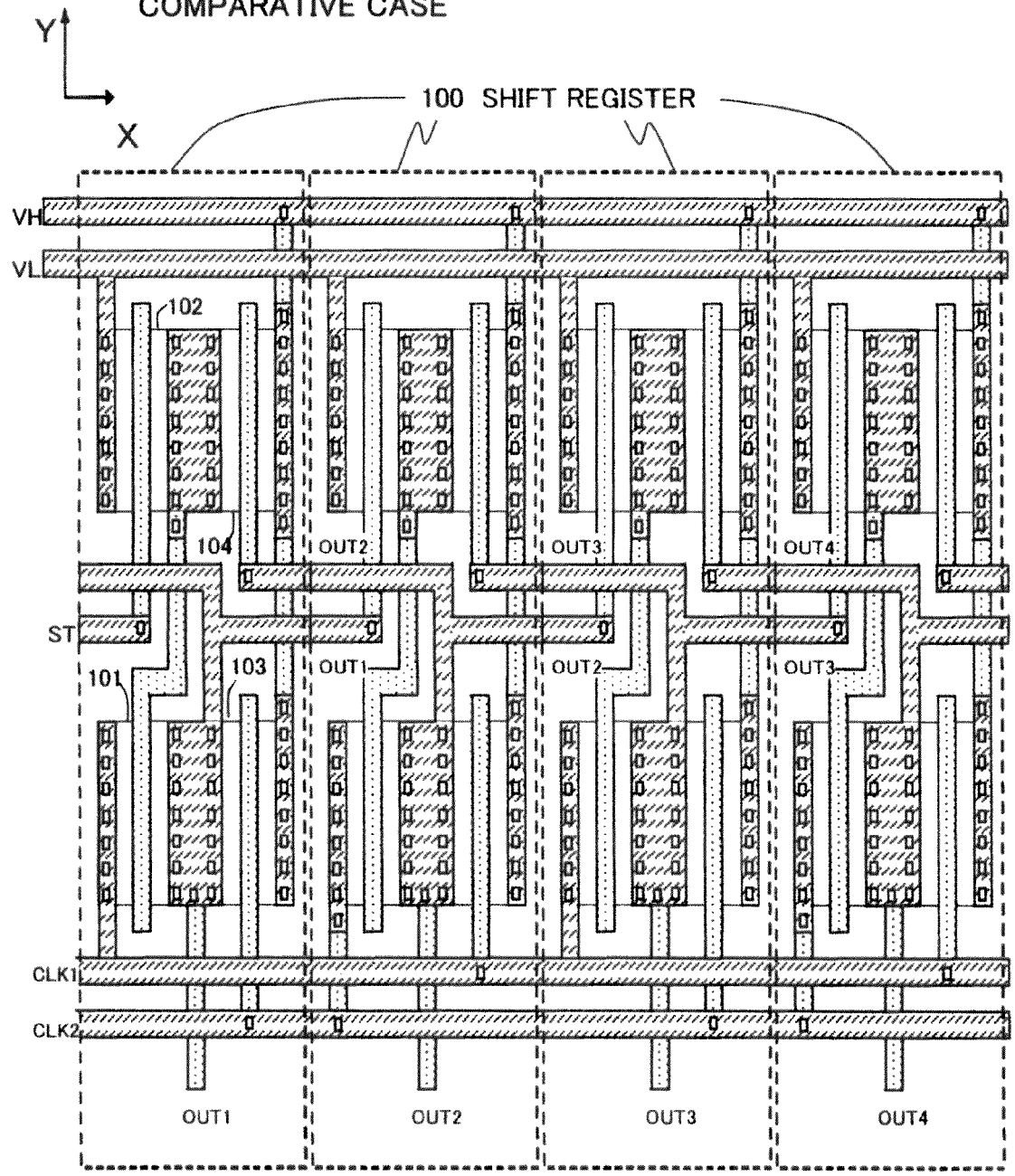
FIG. 6 is a schematic view showing a rectangular layout of the scan line driving circuit (Comparative Example).

FIG. 6 shows, as a comparative example, a case of laying out the scan line driving circuit 8 to a rectangular shape. In general, the spacing between the neighboring shift register circuits 100 is constant in keeping with the distance between the neighboring scan lines 2.

Figure 7:
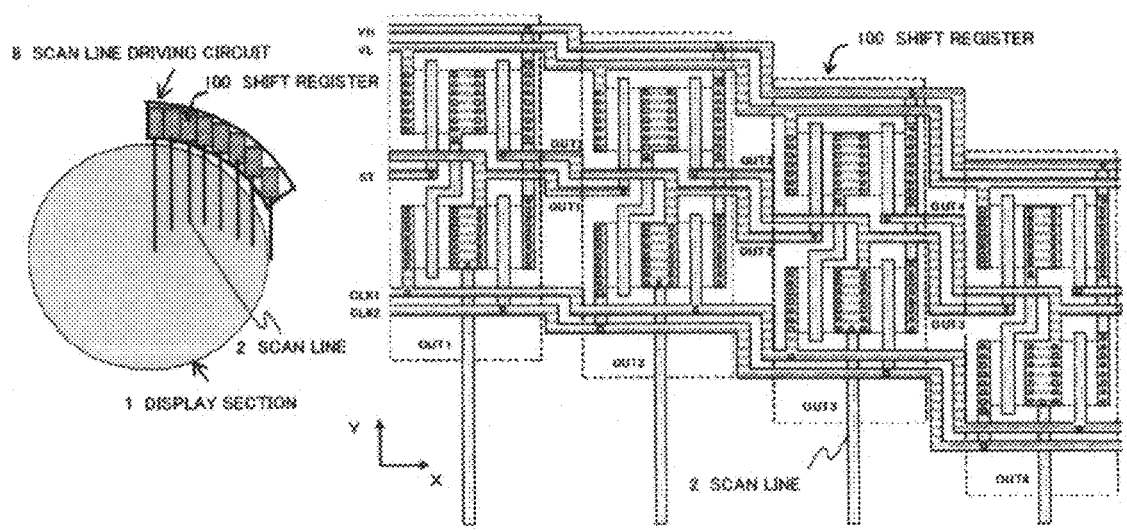
FIG. 7 is a schematic view for illustrating the layout of a scan line driving circuit according to the first exemplary embodiment of the present invention.
Figure 8:
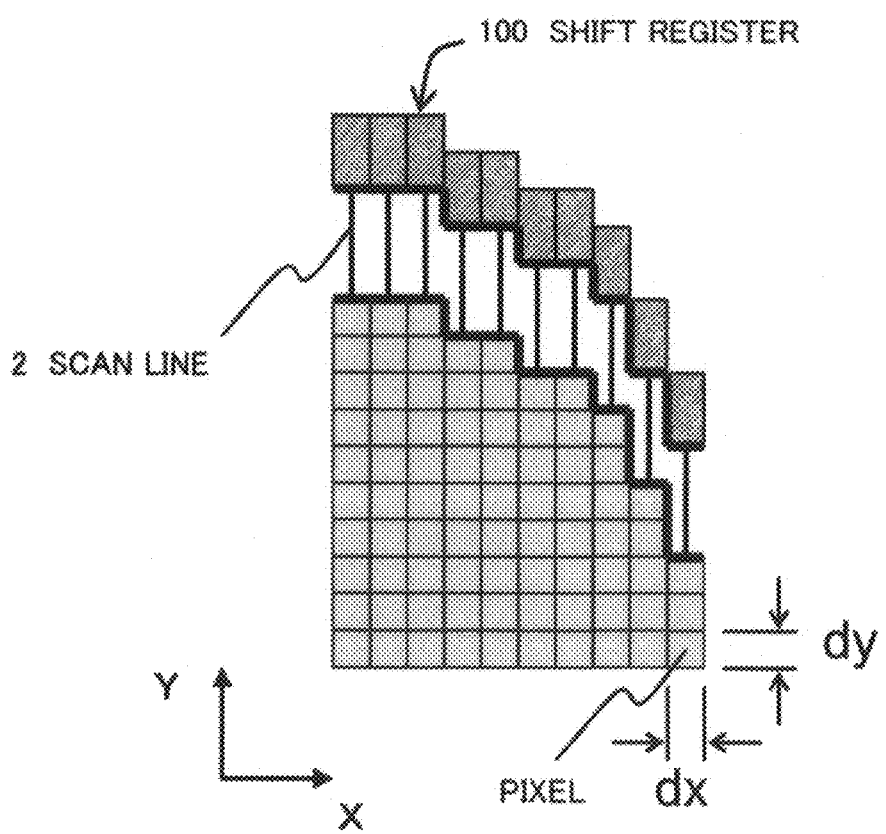
FIG. 8 is a detailed view showing the layout of a scan line driving circuit according to the first exemplary embodiment of the present invention.

FIG. 7 shows an example of the layout according to the present invention in which the scan line driving circuit 8 is curvilinear in its shape so as to extend along the rim of the non-rectangular display section 1.

In FIG. 7, the direction perpendicular to the scan line 2 is labeled the X-direction and that parallel to the scan line 2 is labeled the Y-direction.

If the scan line driving circuit 8 is laid out in a rectangular shape, as shown in FIG. 6, the layout of the shift register 100 is repeatedly translated and duplicated only along the X-direction. On the contrary, in the example shown in FIG. 7, the scan line driving circuit 8 is repeatedly translated and duplicated along both the X- and Y-directions.

Further, the distance of movement along the X-direction is in keeping with the spacing between the neighboring scan lines 2, whereas the distance of movement along the Y-direction is changed between the first and second stages, between the second and third stages and so forth.

This has an advantageous effect that the respective shift registers 100 may be placed so as to be closer to the rim of the curvilinear non-rectangular display section 1.

The distance of movement along the Y-direction may be a multiple of the length along the Y-direction of a pixel that makes up the display section 1.

That is, in the present exemplary embodiment, the display section 1 is formed by a matrix of pixels, with the length of the pixel along the Y-direction being an interval dy and with the length of the pixel along the X-direction being an interval dx, where dy is the spacing between neighboring signal lines 3 and dx is the spacing between neighboring scan lines 2. Hence, the coordinates of pixels for arraying the pixels are based on the intervals dx and dy, even though the display section 1 is non-rectangular in shape.

Thus, the layout of the shift register 100 is moved not only along the X-direction in terms of dx as a unit, but also along the Y-direction in terms of dy as a unit, whereby it is possible to maintain a constant distance between the rim of the display section 1 and the shift register 100. This has a favorable effect that signals output from the respective shift registers 100 may be delivered simultaneously to the scan lines 2 of the display section 1.

The power supply lines VH, VL, clock signal lines CLK1, CLK2 and the interconnecting output lines OUTn−1, OUTn and OUTn+1 between the shift registers are also extended not only along the X-direction but also along the Y-direction to interconnect the shift registers 100.

In the example shown in FIG. 7, the power supply lines, clock signal lines and the interconnecting output lines are extended only along the X- and Y-directions. However, it is also possible to interconnect the shift registers 100 by extending them along oblique directions.

If the distance or spacing differs from one shift register to another, the delay time of the clock signals or that of the shift register outputs is also changed.

It is because the lengths of the signal lines differ from one shift register to another so that the wiring resistance or wiring capacitance thereof is changed.

Hence, with the present exemplary embodiment, it is possible to implement a driving circuit capable of adjusting the delay time of the clock signals or that of the shift register outputs, so that, by proper designing, it is possible to maintain constant delay from one shift register to another.

Second Exemplary Embodiment

Figure 9:
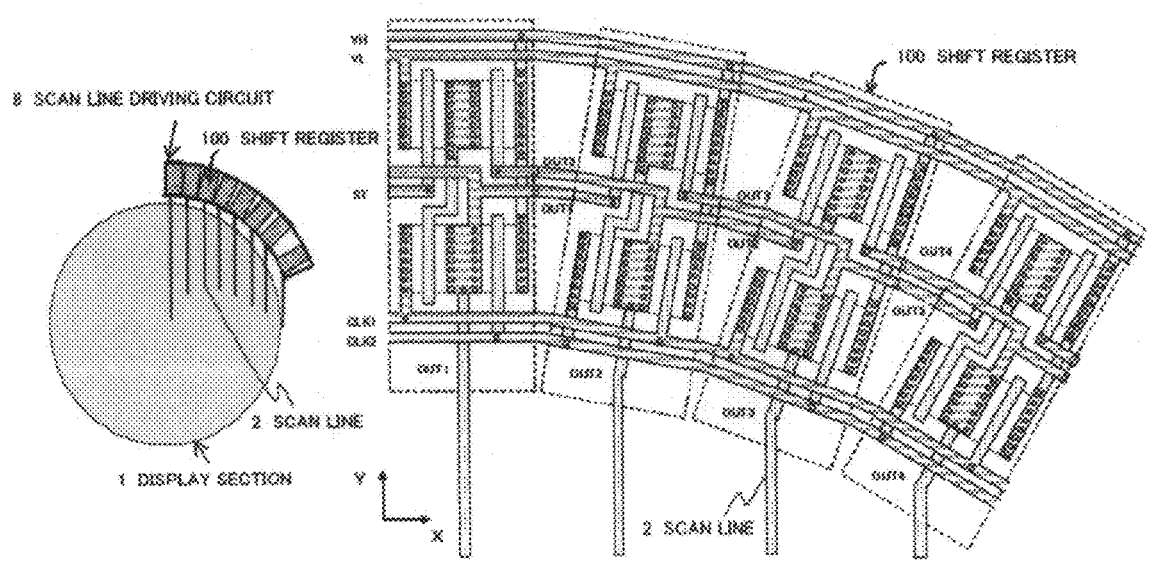
FIG. 9 is a schematic view for illustrating the layout of a second scan line driving circuit according to the present invention.

FIG. 9 shows the layout of a second exemplary embodiment of the present invention. In the present exemplary embodiment, the shift registers 100, which are repeatedly translated in the X- and Y-directions, as shown in FIG. 7, are also tilted at an optional angle.

By so doing, the shift registers 100 may be arranged in the vicinity of the rim part of the display section 1. The power supply lines VH, VL, clock signal lines CLK1, CLK2 and the interconnecting output lines obliquely interconnect the respective shift registers 100, with the shortest path lengths, for instance.

In the present exemplary embodiment, the distance or spacing along the X-direction between the shift registers 100 is equal to that between the neighboring scan lines 2. That is, distance or spacing along the X-direction is constant. However, the distance or spacing along the Y-direction and the pitch of the angle of rotation are changed.

By optionally determining the distance or spacing along the Y-direction and the pitch of the angle of rotation, it is possible to adjust the distance between the neighboring shift registers, that is, the lengths of the clock signal lines and the interconnecting output lines, from one shift register 100 to another.

This allows for adjustment of the delay time of the outputs of the shift registers 100 and the clock signals CLK1, CLK2, so that, by proper designing, it is also possible to maintain a constant delay between the neighboring shift registers.

Third Exemplary Embodiment

Figure 10:
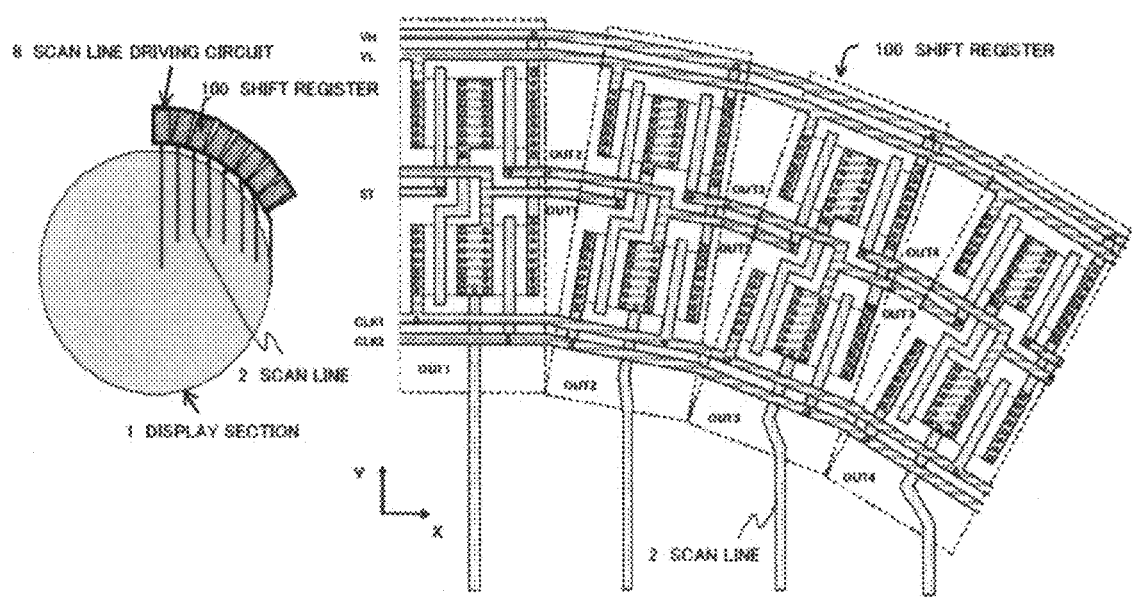
FIG. 10 is a schematic view for illustrating the layout of a third scan line driving circuit according to the present invention.

FIG. 10 shows an example of the layout of a third exemplary embodiment of the present invention. In the present exemplary embodiment, the shift registers, tilted at an optional angle, may be allowed to extend along the rim of the display section 1, and the respective shift registers are arrayed with a narrower pitch.

That is, rectangular shift register 100 (FIG. 3) are placed closer to one another such that the respective corners of the neighboring shift register 100 touch each other. By so doing, it is possible to reduce the length of the scan line driving circuit 8 in its entirety.

If the same length of a part of the rim of the display section 1 as that of FIG. 7 or 9 is taken up by the scan line driving circuit 8, the layout width of each shift register 100 may be set to a larger value.

With the same circuit size, the layout height of the shift register 100 may be correspondingly reduced. It is because the scan line driving circuit 8 becomes narrower in width, thus realizing a display apparatus of a narrower frame edge width.

Fourth Exemplary Embodiment

Figure 11:
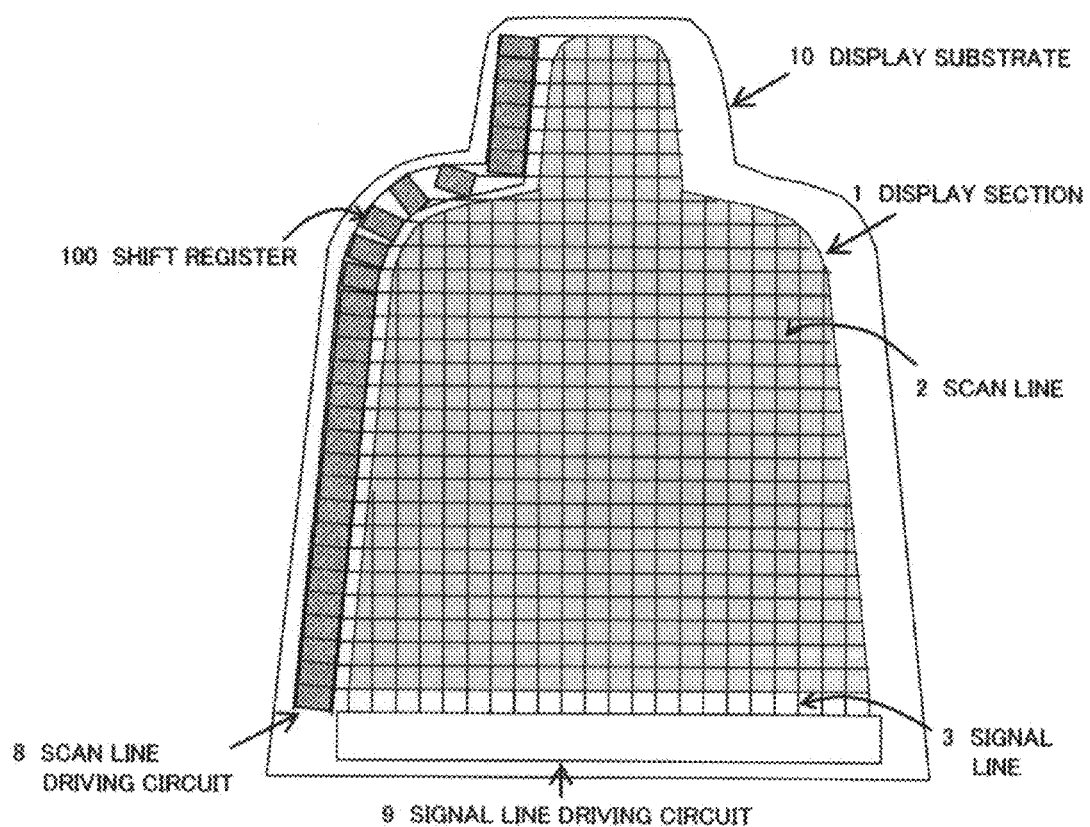
FIG. 11 is a schematic view showing a configuration of a non-rectangular display apparatus according to a fourth exemplary embodiment of the present invention.

A fourth exemplary embodiment of the present invention is now described. FIG. 11 shows a non-rectangular display apparatus of a more intricate shape according to the fourth exemplary embodiment of the present invention. By translation along two directions and by tilting at an optional angle of the shift register 100, laid out to a rectangular shape, it is possible to lay out the scan line driving circuit 8 along the non-rectangular outer circumference of the display section 1.

It should be noticed that unidirectional translation, used up to now, is sufficient for the shift registers neighboring to a rectilinear portion of the non-rectangular outer circumference of the display section 1.

Fifth Exemplary Embodiment

Figure 12:
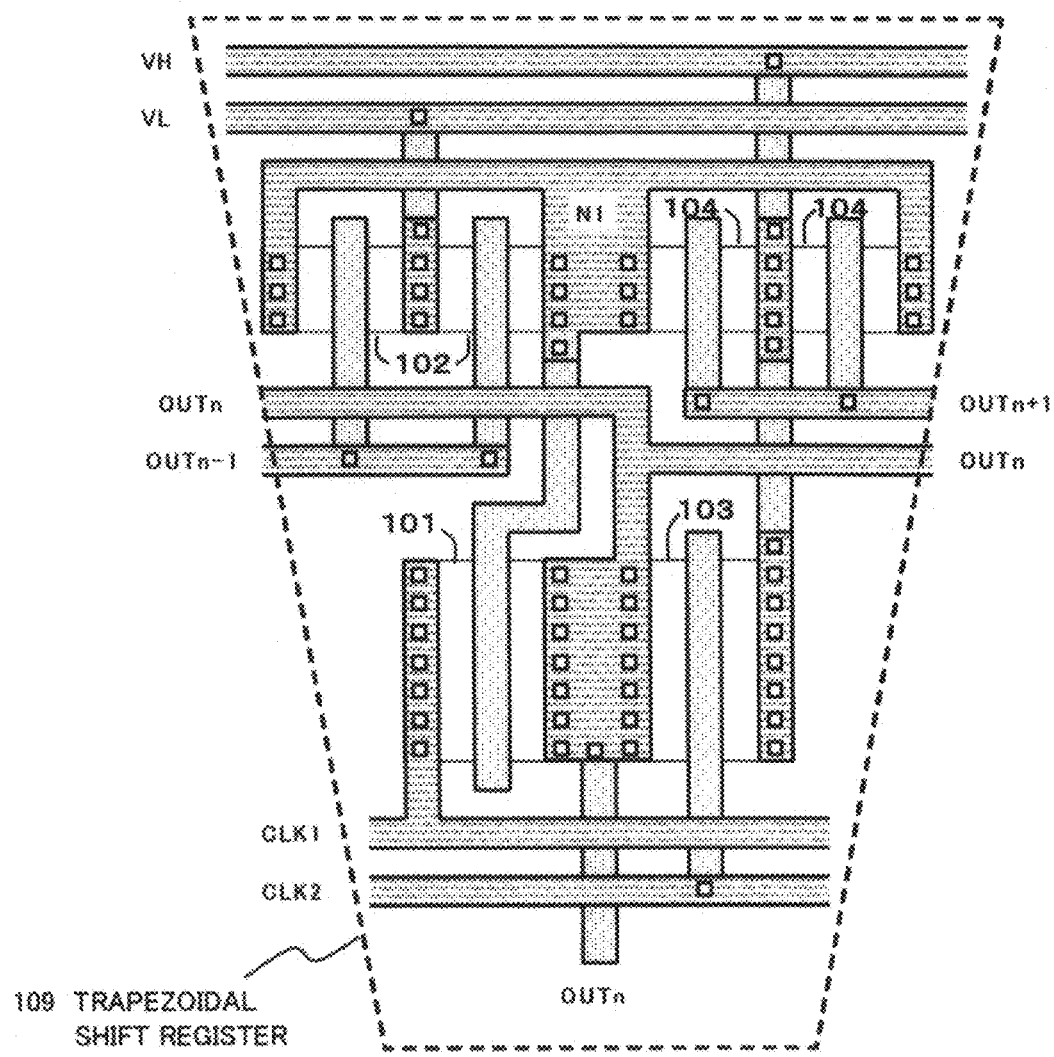
FIG. 12 is a schematic view showing the layout of a shift register of the fourth exemplary embodiment of the present invention.

A fifth exemplary embodiment of the present exemplary embodiment is now described. In the present exemplary embodiment, the shift register, shown in FIG. 2, is laid out not to a rectangular shape but to a trapezoidal shape. FIG. 12 shows an example of layout of the shift register of the present exemplary embodiment.

With the present trapezoidal shift register 109, the lower bottom is of a reduced width to present an inverted trapezoidal shape, and each of thin-film transistors 102, 104 is split in two. The resulting thin-film transistors are arranged side-by-side. This enlarges the width of the upper bottom of the shift register 109, while reducing its height, as compared to the rectangular layout of FIG. 2.

Figure 13:
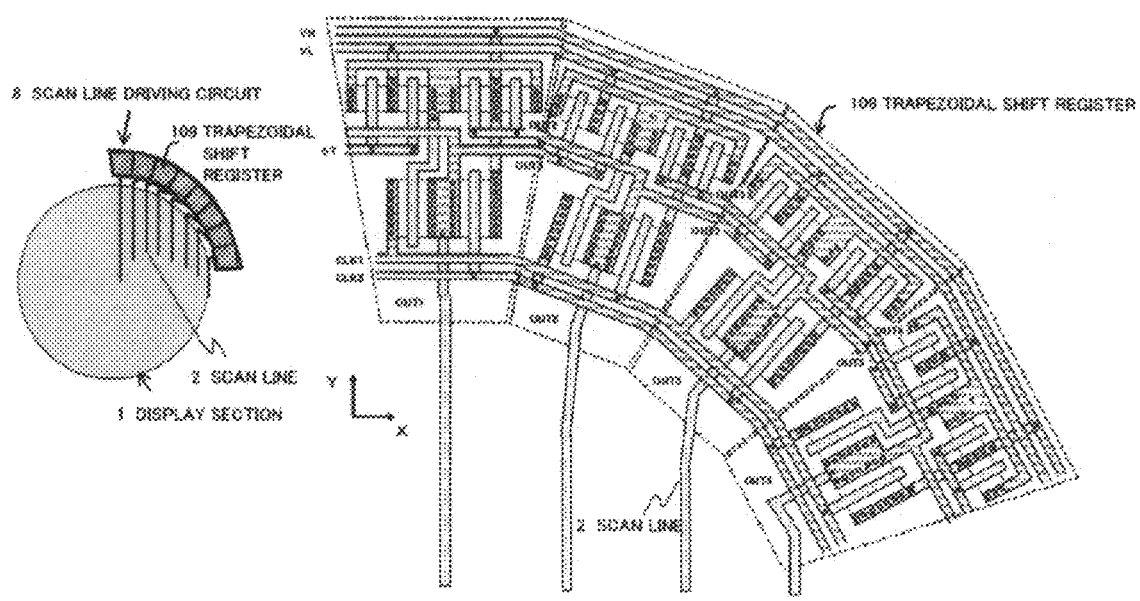
FIG. 13 is a schematic view showing the layout of a scan line driving circuit of the fourth exemplary embodiment of the present invention.

In case a plurality of trapezoidal shift registers 109 are connected to provide the scan line driving circuit 8, neighboring shift registers are placed with the inclined lateral sides of the neighboring trapezoids facing each other, as shown in FIG. 13. By so doing, the triangular void zones between the neighboring shift registers which are present in the examples shown in FIGS. 9 and 10, may be eliminated due to the widened upper sides of the trapezoidal shapes, without increasing the overall length of the scan line driving circuit 8.

On the other hand, each trapezoidal shift register 109 is reduced in height, as compared to the exemplary embodiment shown in FIG. 2, thus achieving the scan line driving circuit 8 with a reduced height and a smaller width.

Sixth Exemplary Embodiment

Figure 14:
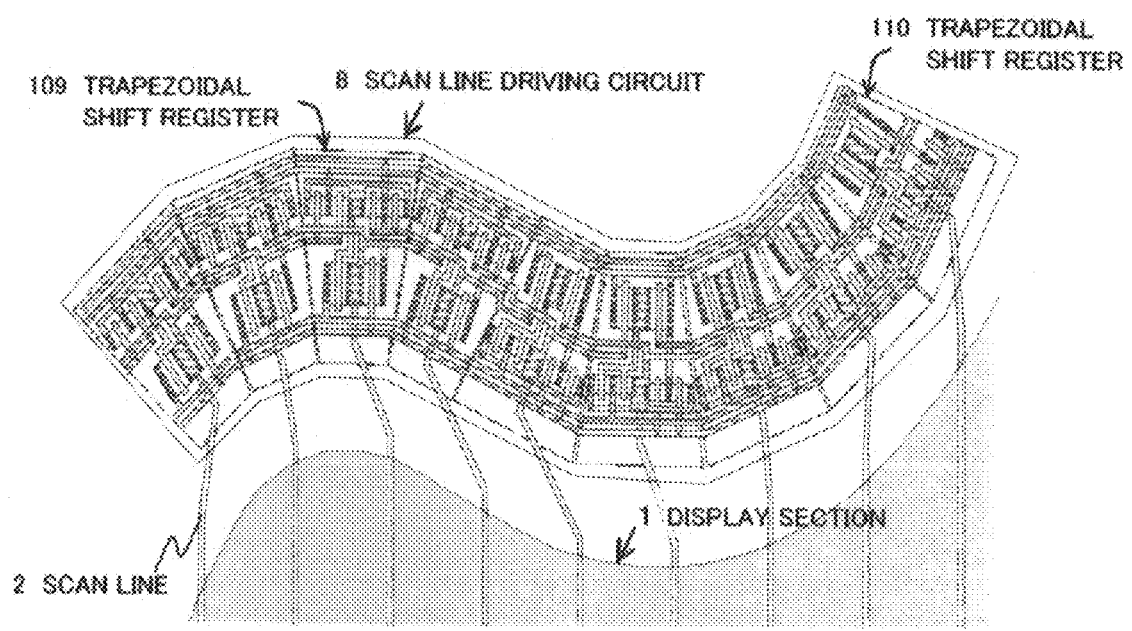
FIG. 14 is a schematic view for illustrating the layout of a scan line driving circuit according to a fifth exemplary embodiment of the present invention.

A sixth exemplary embodiment of the present invention is now described with reference to FIG. 14, in which the scan line driving circuit 8, composed of a plurality of trapezoidal shift registers 109, 110, is used for the display section 1 having an intricate curvilinear outer circumference.

Figure 15:
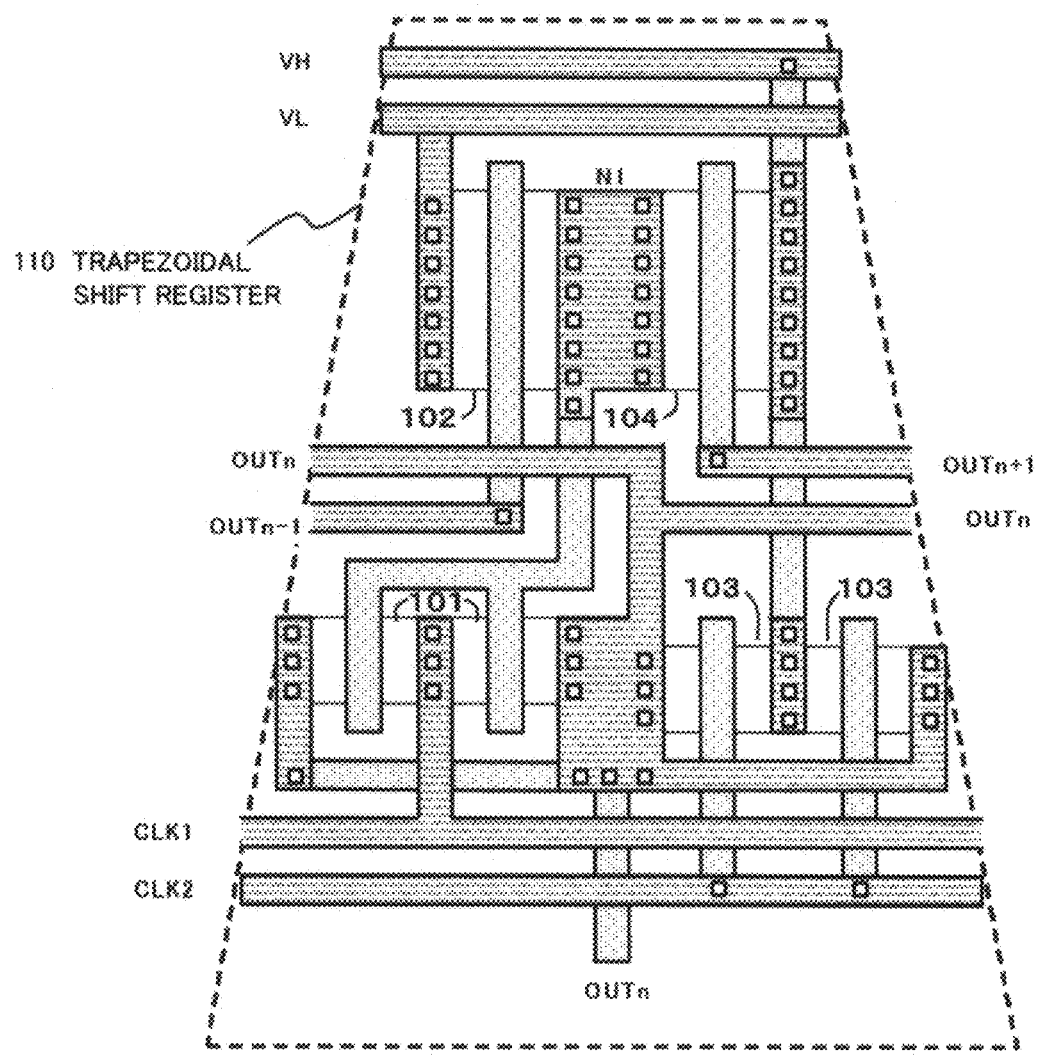
FIG. 15 is a schematic view showing the layout of a shift register according to a sixth exemplary embodiment of the present invention.

The trapezoidal shift register 110 has a bottom part, enlarged in width, as shown in FIG. 15. The shift register of the layout, shown in FIG. 15, is combined with the trapezoidal shift register 109, having a broader width of the upper bottom, as shown in FIG. 15. The resulting configuration is able to follow up the outer circumference of the display section 1 having an intricate curvilinear shape.

Seventh Exemplary Embodiment

Figure 16:
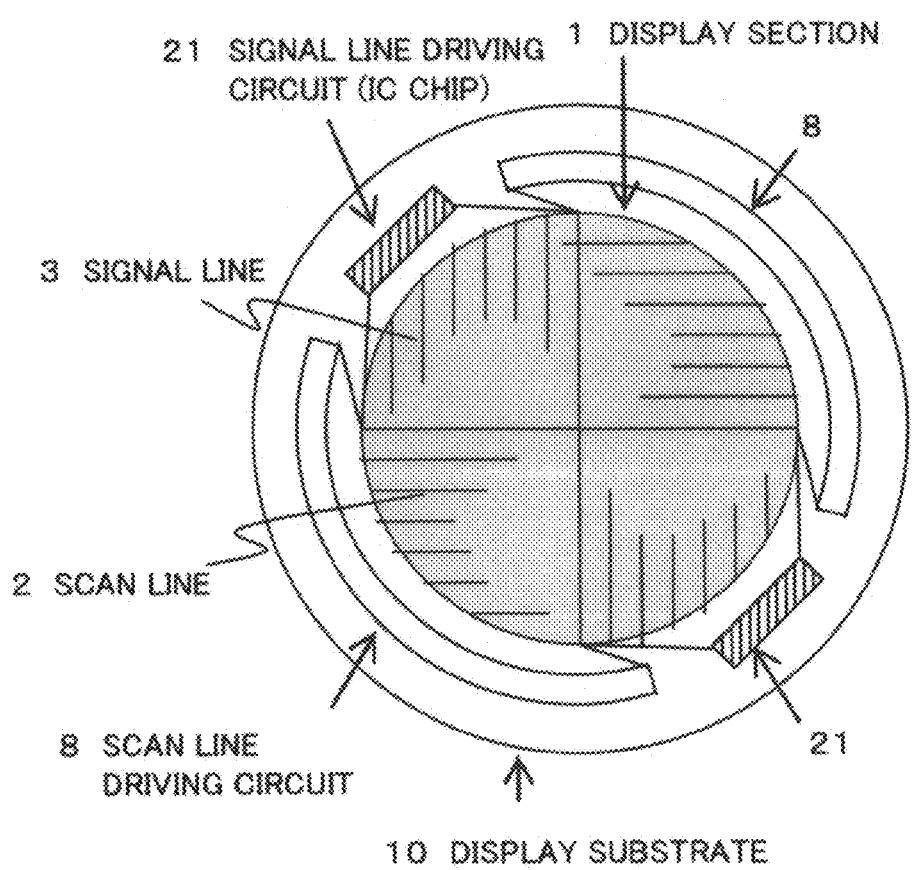
FIG. 16 is a plan view showing the configuration of a non-rectangular display apparatus according to a seventh exemplary embodiment of the present invention.

A seventh exemplary embodiment of the present invention is now described. Referring to FIG. 16, showing a display apparatus of the seventh exemplary embodiment, the scan line driving circuits 8 and an IC chip signal line driving circuits 21 are provided in combination. The scan line driving circuits and the IC chip signal line driving circuits are provided for extending around the rim of the non-rectangular display section 1. The scan line driving circuit 8 is formed by thin-film transistors produced on the same display substrate 10 by the same process as that of producing the thin-film transistors that make up the active matrix display section 1.

The signal line driving circuit 21 is an IC chip mounted on the display substrate 10. The IC chip, also indicated by the reference numeral 21, is sliced to a rectangular shape from a silicon wafer, for example, using a commonly used dicing equipment.

In general, the size of the IC chip 21 is smaller than the size of a corresponding circuit that might have been generated using thin-film transistors, mainly due to fine wiring width and the fine channel width of the transistor produced. Hence, a shorter length of the outer circumference part of the display section 1 taken up by the IC chip suffices.

Hence, the layout may be such that the scan line driving circuit 8, constituted by the thin-film transistors, will be longer in length, whereby the relative length of the scan line driving circuit, extending along the outer circumference of the display section 1, may be longer.

By so doing, the scan line driving circuit 8 may be relatively reduced in width, thus realizing a display apparatus of a reduced frame edge width in which the size of the display section 1 is more proximate to the size of the display substrate 10.

Eighth Exemplary Embodiment

Figure 17:
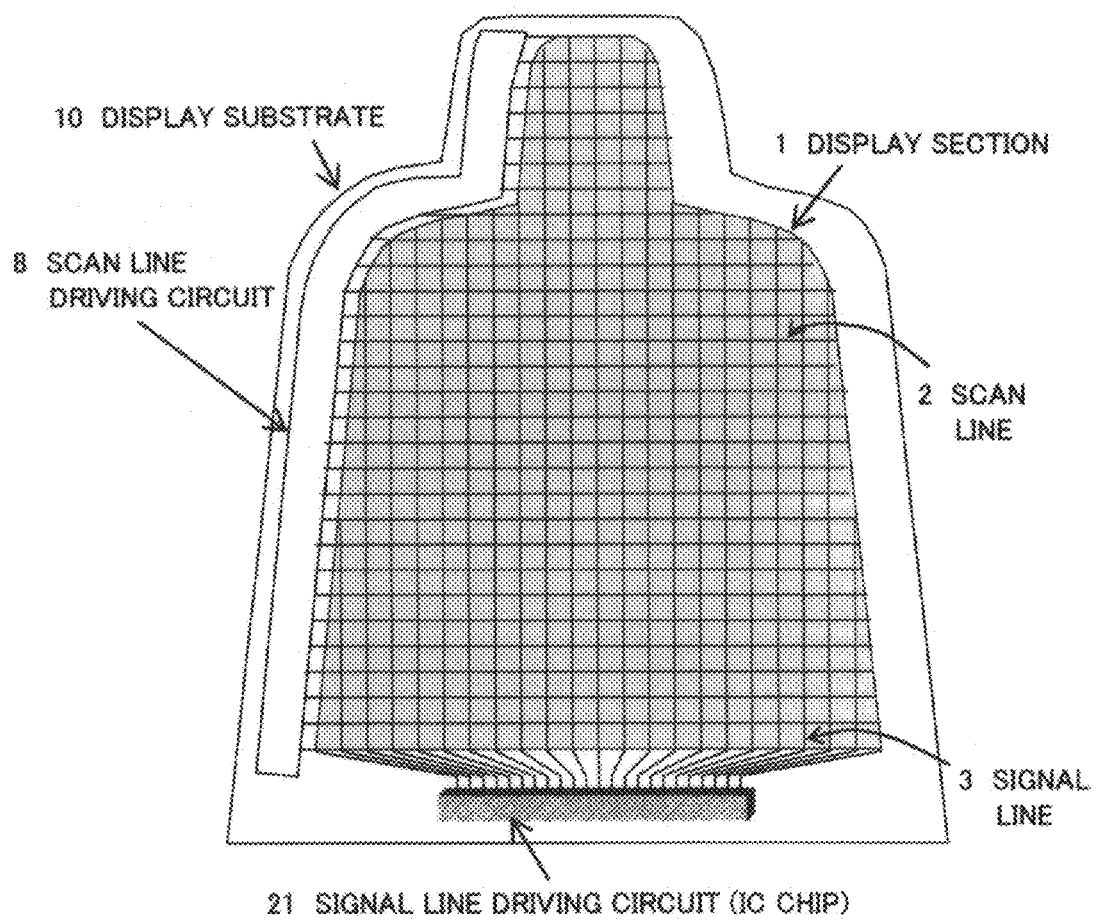
FIG. 17 is a plan view showing the configuration of a non-rectangular display apparatus according to an eighth exemplary embodiment of the present invention.

An eighth exemplary embodiment of the present invention is now described. FIG. 17 shows the display apparatus of the eighth exemplary embodiment in which a scan line driving circuit 8, composed of thin-film transistors, is combined with a signal line driving circuit 21 of an IC chip.

The rectangular signal line driving circuit 21 of the IC chip is mounted adjacent to a rectilinear side of a non-rectangular display section 1. On a curvilinear side of the non-rectangular display section, there is laid out the scan line driving circuit 8 having a corresponding shape.

A non-rectangular display apparatus of a reduced frame edge width may be realized in comparison with the case where all driving circuits are implemented as rectangular IC chips.

Ninth Exemplary Embodiment

Figure 18:
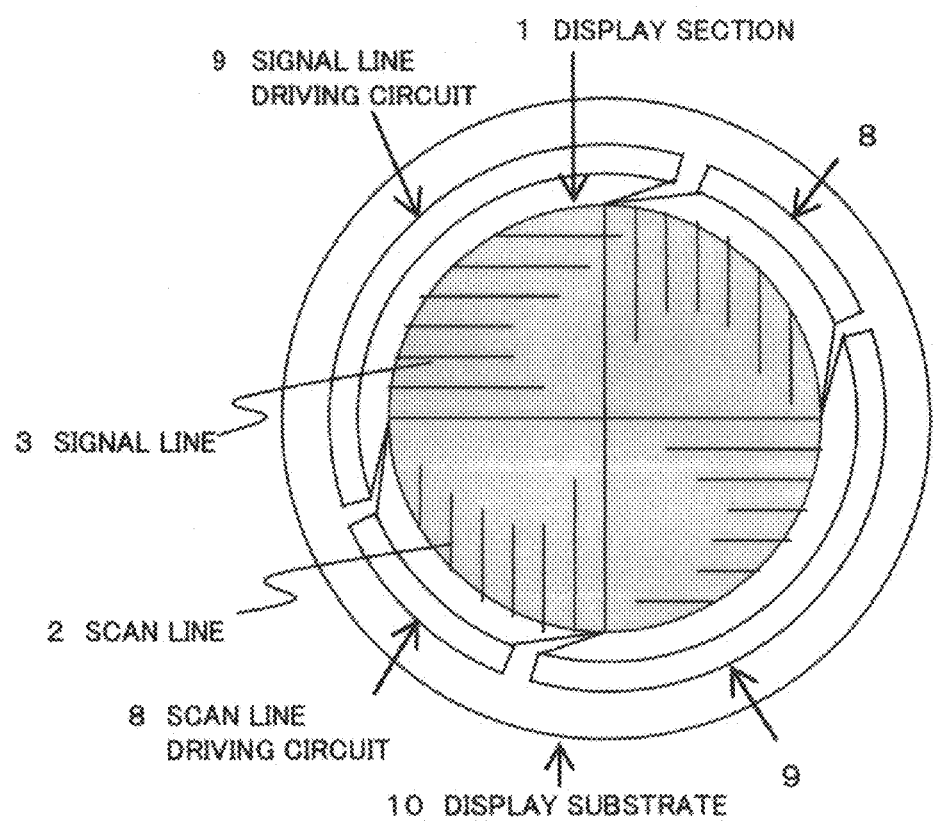
FIG. 18 is a plan view showing the configuration of a non-rectangular display apparatus according to a ninth exemplary embodiment of the present invention.

A ninth exemplary embodiment of the present invention is now described. FIG. 18 shows the display apparatus of the ninth exemplary embodiment of the present invention in which there are provided scan line driving circuits 8 and signal line driving circuits 9 shaped to conform to and lying close to the outer circumference of the non-rectangular display section 1. These circuits 8, 9 are arranged adjacent to the display section 1.

The present exemplary embodiment differs from the first exemplary embodiment, shown in FIG. 1, in that the signal line driving circuit 9 is laid out with a length longer than the length of the scan line driving circuit 8. That is, the length of the outer circumference of the display section 1 facing the signal line driving circuit 9 is longer than that facing the scan line driving circuit 8.

In general, the signal line driving circuit, composed by D/A converters, analog amplifiers and the like, has more transistors and more complicated wiring configuration than the scan line driving circuit composed by shift registers. Thus, if the signal line driving circuit is formed by the same thin-film transistors, the layout area tends to be larger.

Thus, the signal line driving circuit 9 is laid out to a longer length and the scan line driving circuit is laid out to a shorter length, whereby the signal line driving circuit 9 is reduced in width, while the scan line driving circuit is increased in width.

In case the two circuits are of equal width, the distance between the rim of the display section 1 and the rim of the display substrate 10 may be more uniform over the entire rim length, whereby the display substrate 10 and the display apparatus may be realized which are similar in shape to the non-rectangular display section 1.

Tenth Exemplary Embodiment

Figure 19:
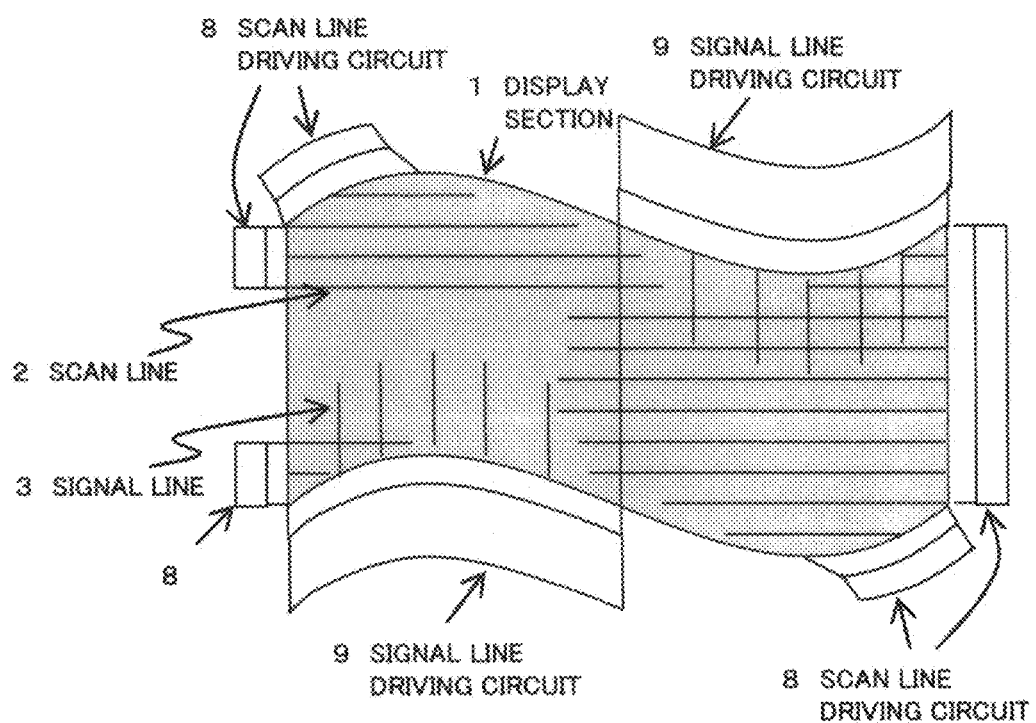
FIG. 19 is a plan view showing the configuration of a non-rectangular display apparatus according to a tenth exemplary embodiment of the present invention.

A tenth exemplary embodiment of the present invention is now described. Referring to FIG. 19, the tenth exemplary embodiment of the present invention has a non-rectangular display section 1 having a shape other than a circular shape. The display section 1 has rectilinear lateral sides and upper and lower curvilinear sides. A number of scan lines 2 and a number of signal lines 3 are arranged on this display section 1 for extending along the transverse direction and along the vertical direction, respectively. The signal lines 3, arranged on the right side of the drawing, are driven by the signal line driving circuit 9, arranged on the right upper part of the drawing, whereas the signal lines 3, arranged on the left side of the drawing, are driven by the signal line driving circuit 9, arranged on the left lower part of the drawing.

The signal line driving circuits 9 are of curvilinear shape to conform to the curvilinear rim part of the display section.

The scan lines 2 are driven by the associated scan line driving circuits 8, arranged split on the left and right sides.

The scan line driving circuit 8, arranged on the right side, drives the majority of the scan lines on a display surface. The scan line driving circuit 8, arranged on the left side, is responsible for driving the scan lines which are interrupted due to curvature of the display section.

Eleventh Exemplary Embodiment

Figure 20:
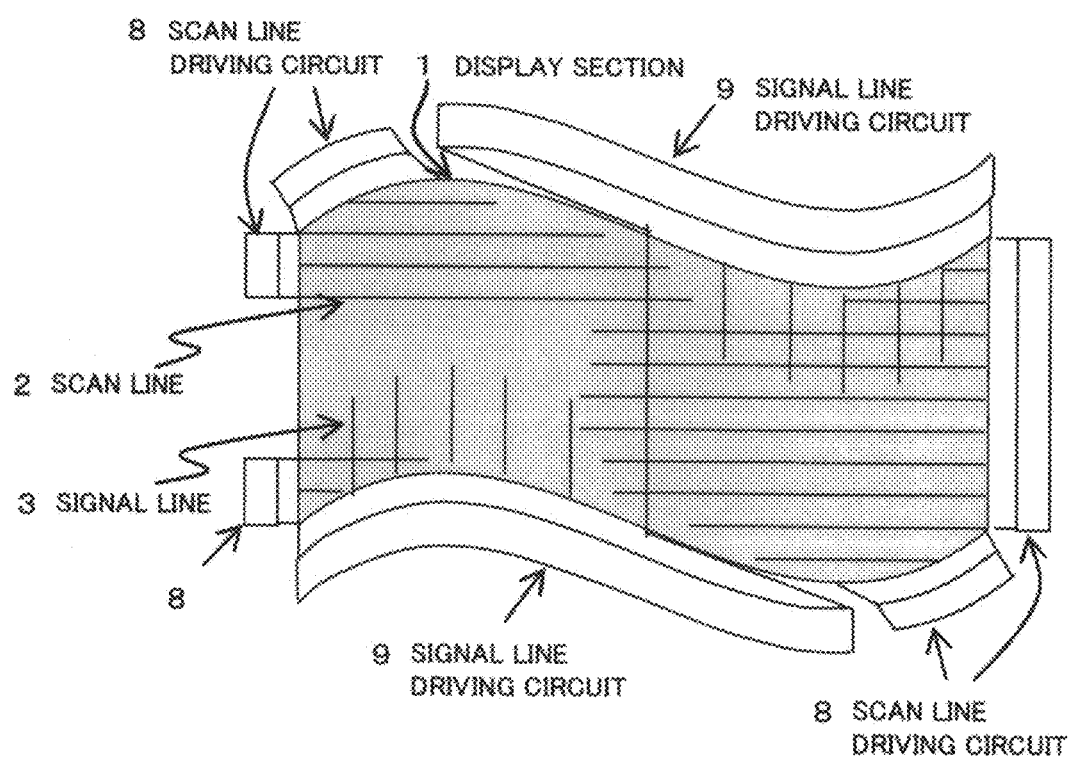
FIG. 20 is a plan view showing the configuration of a non-rectangular display apparatus according to an eleventh exemplary embodiment of the present invention.

An eleventh exemplary embodiment of the present invention is now described. In the tenth exemplary embodiment shown in FIG. 19, there is a region in the curvilinear rim of the display section 1 which is faced by neither the scan line driving circuit 8 nor the signal line driving circuit 9. Referring to FIG. 20, in the present eleventh exemplary embodiment, there is provided a signal line driving circuit 9 that is laid out to longer length along the curvilinear rim of the display section 1 so that the region in the curvilinear rim of the display section 1 that is faced by neither the scan line driving circuits 8 nor the signal line driving circuits 9 in FIG. 19, is faced by the signal line driving circuit 9.

This causes the layout width of the signal line driving circuit 9 to be narrower to realize a narrower frame edge width.

Twelfth Exemplary Embodiment

Figure 26:
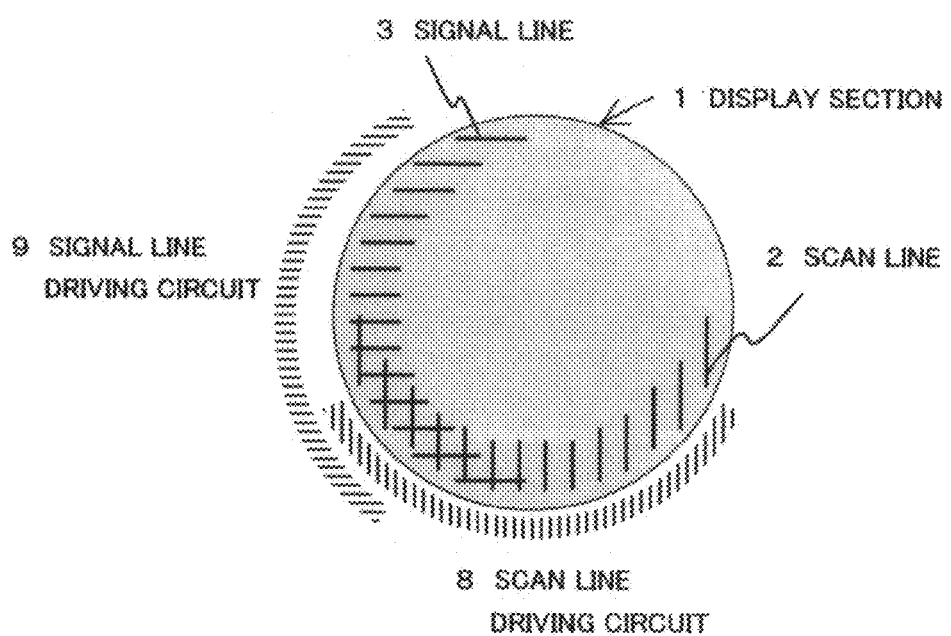
FIG. 26 is a plan view showing the configuration of a non-rectangular display apparatus according to a twelfth exemplary embodiment of the present invention.

A twelfth exemplary embodiment of the present invention is now described. Referring to FIG. 26, the display apparatus of the present twelfth exemplary embodiment includes a scan line driving circuit 8 and a signal line driving circuit 9. These circuits are shaped to conform to the outer circumference part of the non-rectangular display section 1, and are arranged facing and adjacent to the display section 1.

The present exemplary embodiment differs from the above-described first exemplary embodiment in that the number of the scan line driving circuits 8 and that of the signal line driving circuits 9 are lesser. In case there are provided a plurality of the scan line driving circuits 8 and a plurality of the signal line driving circuits 9, it is necessary to take synchronization between the scan line driving circuits 8 and between the signal line driving circuits 9 in order to effect sequential operations. That is, in the case of the scan line driving circuit 8, the shift register outputting the OUTn of FIG. 2, out of the multiple shift registers 100, making up the scan line driving circuit 8, is supplied with the output OUTn−1 of the previous stage shift register and with the OUTn+1 of the next stage shift register, as inputs, in order to take synchronization. Similar synchronization is needed for each of the multiple scan line driving circuit 8. The necessity for taking such synchronization may be eliminated or alleviated in case the number of the scan line driving circuits 8 or the signal line driving circuits 9 is lesser, as in the present exemplary embodiment.

Figure 24:
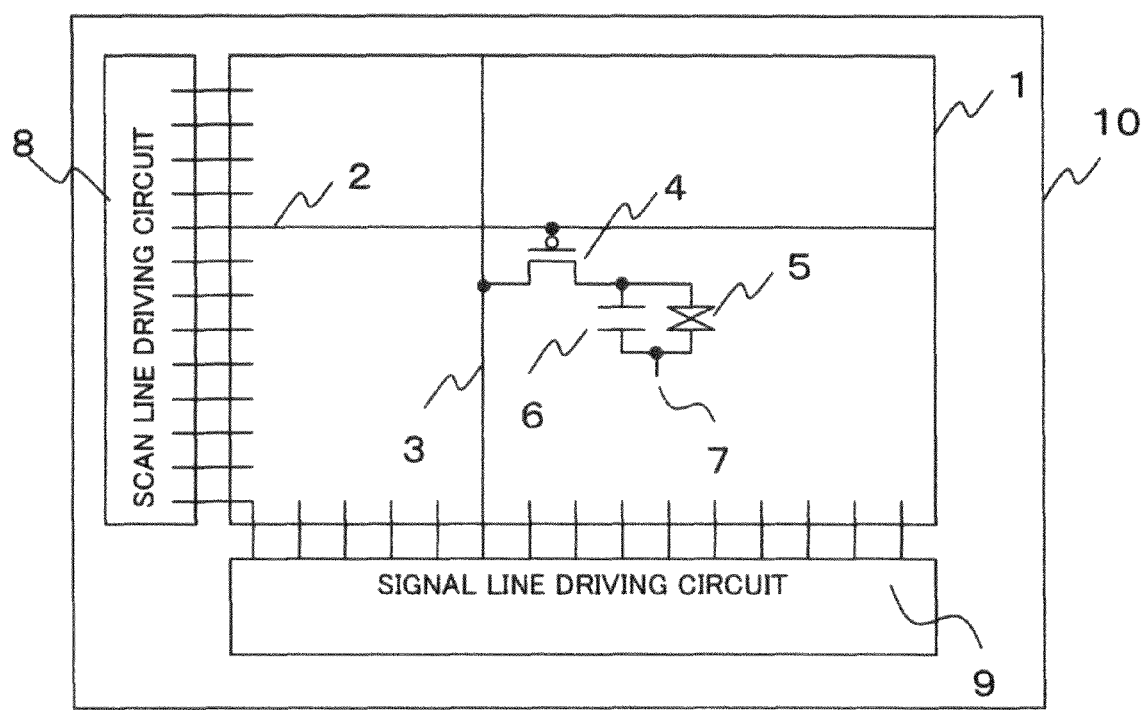
FIG. 24 is a schematic plan view showing a rectangular display apparatus.
Figure 25:
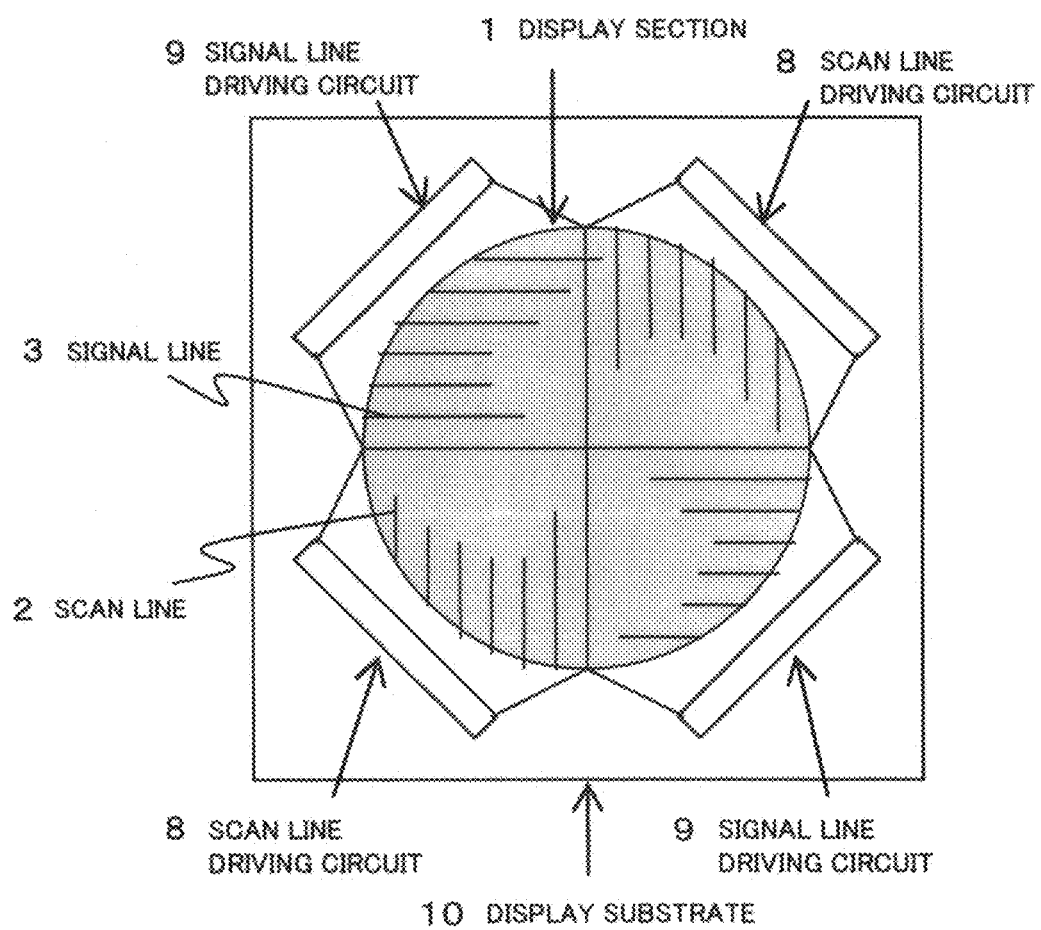
FIG. 25 is a schematic plan view showing the configuration of a conventional non-rectangular display apparatus.
Figure 27:
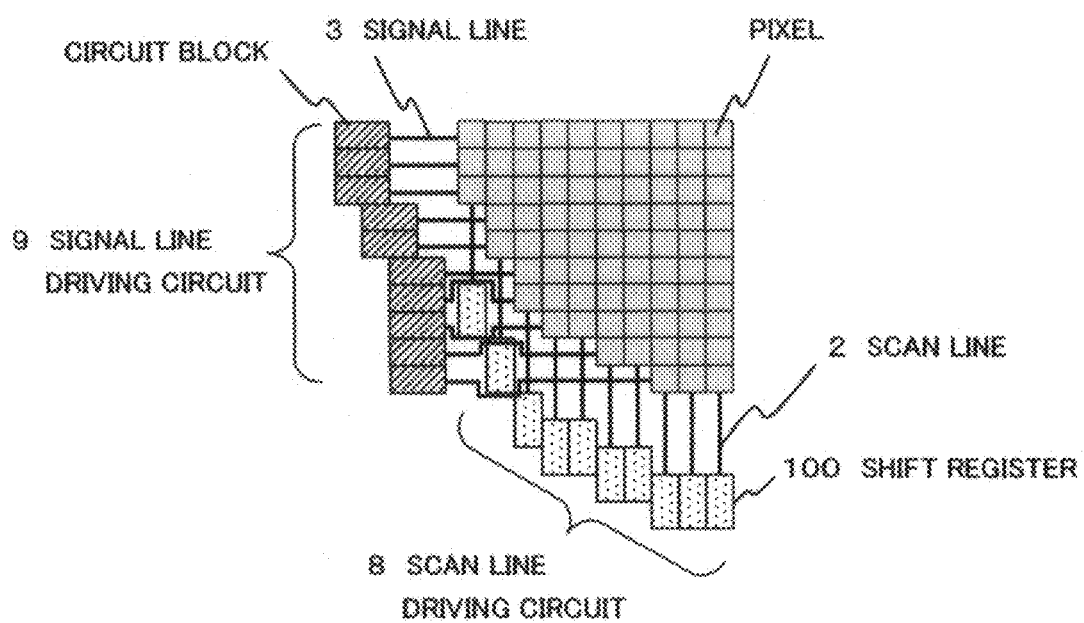
FIG. 27 is a detailed plan view showing the configuration of a non-rectangular display apparatus according to the twelfth exemplary embodiment of the present invention.

In the above-described first exemplary embodiment, only one scan line driving circuit 8 or only one signal line driving circuit 9 is provided adjacent to the same rim part of the non-rectangular display section 1. In the present exemplary embodiment, two driving circuits 8 and 9 are arranged adjacent to the same rim part. The manner in which the shift registers 100 forming the scan line driving circuit 8 and the circuit blocks forming the signal line driving circuit 9 are arranged in such case is shown in FIG. 27, which is a partial enlarged view illustrating the site where the two driving circuits are arranged adjacent to each other. When the signal line 3, driven by the circuit block, is connected to the array of pixels, the signal line necessarily collides against the scan line driving circuit 8. However, the interference of the signal line with the scan line driving circuit 8 is minimized by allowing the signal line 3 to pass through a gap between split shift registers 100. If the signal line 3 intersects the scan line 2 in an area outside the display section 1, there is no intersecting site where there is the thin-film transistor 4 or the pixel 5 such as is shown in FIG. 24. Hence, the adverse effect on the display is negligibly small.

Thirteenth Exemplary Embodiment

Figure 28:
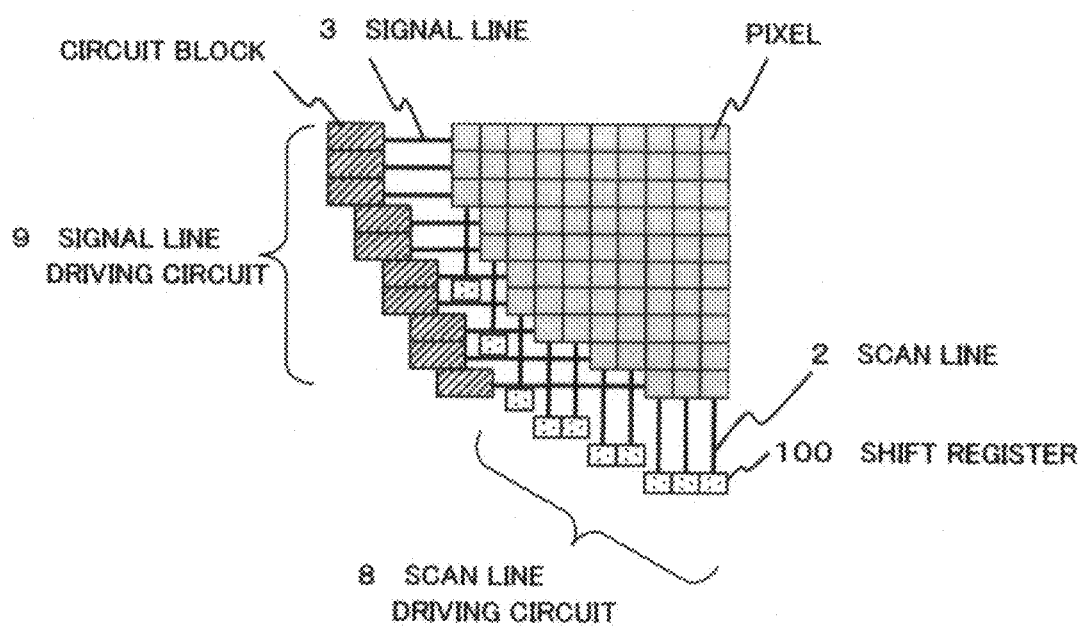
FIG. 28 is a detailed plan view showing the configuration of a non-rectangular display apparatus according to a thirteenth exemplary embodiment of the present invention.

A thirteenth exemplary embodiment of the present invention is now described. Referring to FIG. 28, showing the display apparatus according to the present invention, the block size of the shift register 100, forming the scan line driving circuit 8, is lesser than the area of a rectangle having the interval between the neighboring scan lines 2 as a transverse width and the interval between the neighboring signal lines 3 as a vertical width. That is, the layout size of the shift register 100 is smaller than the area delimited by two neighboring scan lines 2 and by two neighboring signal lines 3.

The present exemplary embodiment differs from the twelfth exemplary embodiment shown in FIG. 27 in that the signal lines 3 emanating from the signal line driving circuit 9 is not warped but simply extended in order to pass through the gap between the shift registers 100 to get to the pixel array without interference against the scan line driving circuit 8. In FIG. 27, in which the signal line 3 is warped, the distance between the neighboring signal lines is appreciably fluctuated to pose the problem of interference between two neighboring signal lines. With the present exemplary embodiment, the distance between the neighboring signal lines may be kept constant and hence it becomes possible to suppress the interference between the signal lines. Here, limitations are imposed on the size of the shift registers 100 of the scan line driving circuit 8 arranged more proximate to the display section 1. If it is the signal line driving circuit 9 that is arranged more proximate to the display section 1, such limitation may be imposed on the size of the corresponding components of the signal line driving circuit 9.

In the above-described exemplary embodiments, the active elements that make up the driving circuit and those that make up the pixel are thin-film transistors. These active elements may also be diodes or the like devices without departing from the scope of the invention.

A large variety of active elements may also be used in combination. For example, diodes may be used for the pixels and the thin-film transistors may also be used for the driving circuits.

Also, in the above-described exemplary embodiments, the pixel used is the liquid crystal. However, an electroluminescence material may also be used without departing from the scope of the invention. The electroluminescence material may include an inorganic material or an organic material. If the shape of a sealing plate of, for example, glass, used for improving the reliability in case of using an organic material, for example, is made similar to the shape of the display section, it would be possible to realize a non-rectangular display apparatus having a high designing effect. If the outer shape of an optical component, such as a circular polarization plate, often used to prevent reflection of extraneous light, is made similar to the shape of the display section, it would again be possible to realize a non-rectangular display apparatus having a high designing effect.

Figure 21:
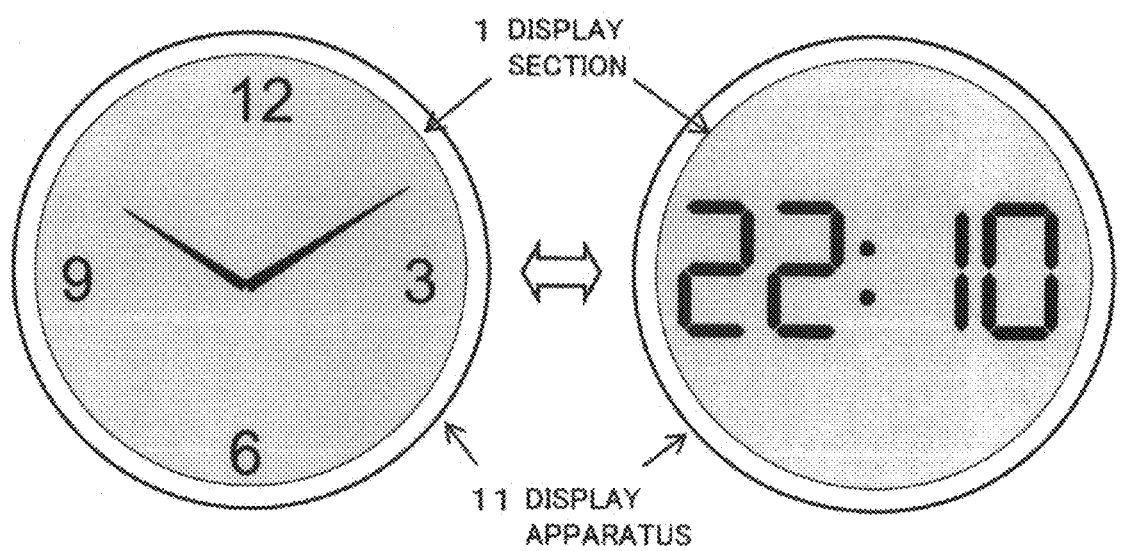
FIG. 21 is a plan view showing an analog/digital timepiece having a circular display section.
Figure 22:
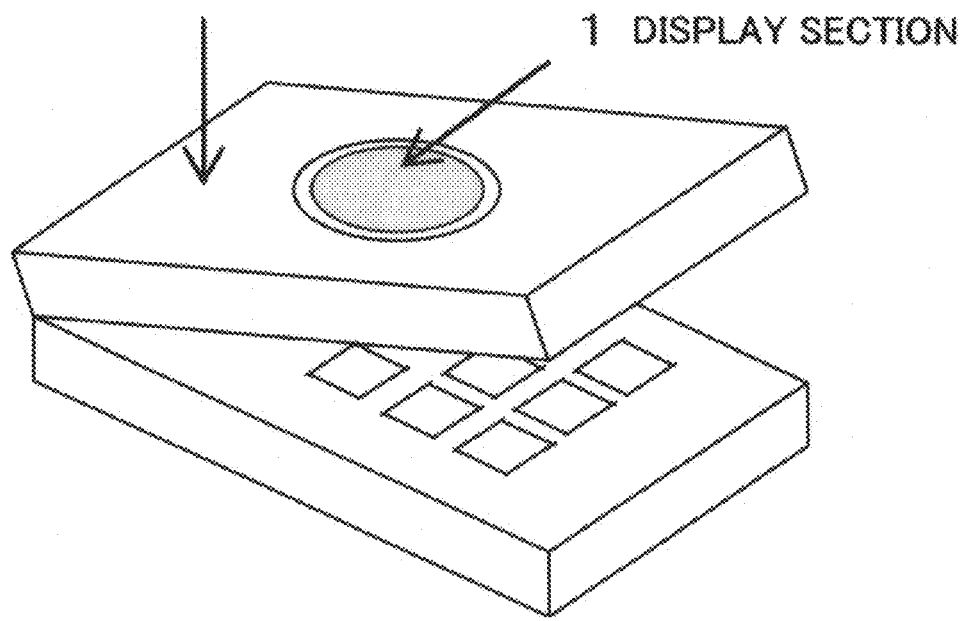
FIG. 22 is a perspective view showing a mobile phone having a built-in display device.

With the use of the exemplary embodiments of the present invention, a circular timepiece having a narrow frame edge width may be produced, as shown in FIG. 21. That is, by laying out the scan line driving circuit 8 and the signal line driving circuit 9 so as to be of a curvilinear shape to conform to the shape of the display section, as shown in FIG. 7, the shape of the display substrate 10 and that of the display apparatus 11 may be made similar to the shape of the display section 1.

With the active matrix display section, constituted by the multiple scan lines, multiple signal lines and pixels, the display with high definition may be made possible, while the display as an analog timepiece and the display as a digital timepiece may be used in a switching way, as shown in FIG. 21.

The timepiece may be fitted with a watch band for use as a wrist-watch.

The display apparatus may be built in a mobile phone, in which case the narrow frame edge width of the apparatus may be in full play and helps reduce the assembling space.

Figure 23:
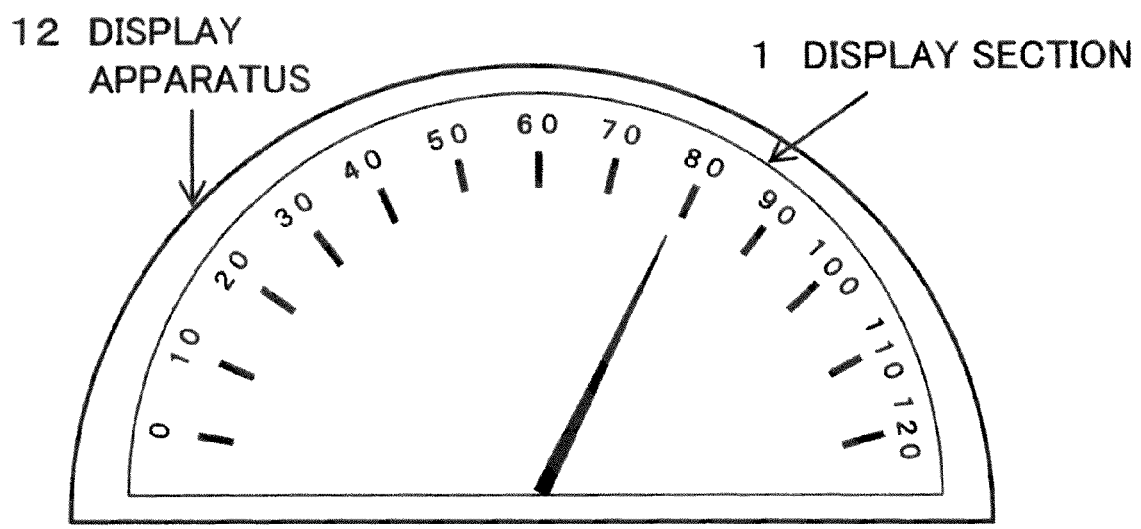
FIG. 23 is a plan view showing a speedometer having a semi-circular display section.

In case the present invention is applied to a semicircular speedometer shown in FIG. 23, the configuration shown for example in FIG. 17 may be applied. That is, a rectangular driving circuit, formed by a semiconductor IC, is arranged facing the rectilinear side of the display section 1, and a driving circuit, having a curvilinear shape to conform to the rim part of the display section, is laid out for extending along at least a quarter circle portion.

By so doing, a speedometer having a semi-circular display section of a narrow frame edge width may be achieved, thus decreasing the wasteful mounting capacity when the meter is mounted on an automotive vehicle.

Figure 29:
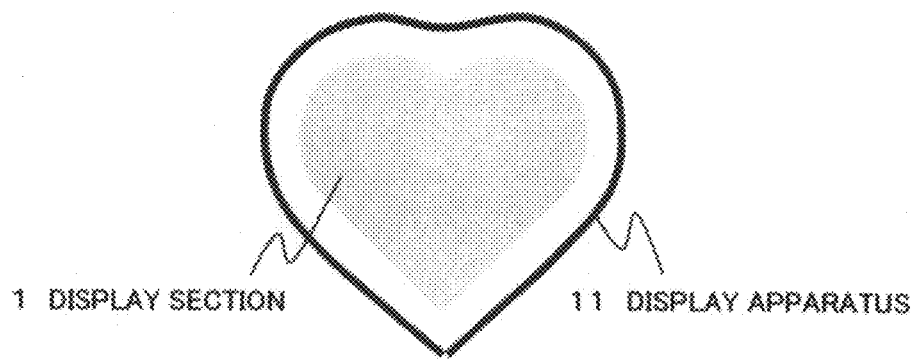
FIG. 29 is a plan view showing a display apparatus having a heart-shaped display section.
Figure 30:
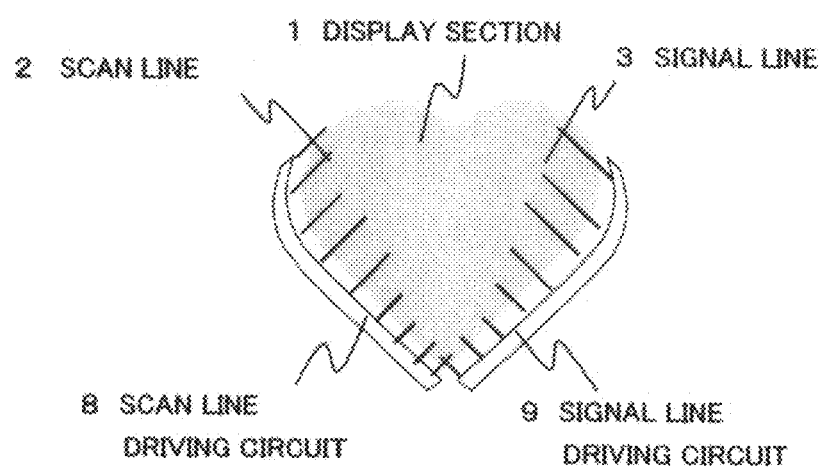
FIG. 30 is a plan view showing the heart-shaped display section.

With the use of the exemplary embodiment of the present invention, a heart-shaped display apparatus, shown in FIG. 29, may be produced. That is, by laying out the scan line driving circuit 8 and the signal line driving circuit 9, having a curvilinear shape to conform to the outer circumference of the display section 1, as shown in FIG. 30, the shape of the display apparatus 11 may be made similar to the shape of the display section 1.

With the active matrix display section, made up of multiple scan lines, multiple signal lines and pixels, the heart-shaped display apparatus may be used as a digital pendant or a digital locket capable of demonstrating a high definition digital image.

In case the exemplary embodiments of the present invention are used for an advertisement display demonstrating advertisement images of moving pictures or still images, it would be possible to furnish a display of a shape matched to goods to be advertised by exploiting the feature that the display section and the apparatus may optionally be set to a desired shape.

Among the uses of the present invention, there are, for example, a mobile terminal with a built-in non-rectangular display apparatus having an active matrix, a mobile phone, a digital/analog timepiece, a timepiece capable of multi-functional display, such as a calendar, temperature or pneumatic pressure, speedometer for an automotive vehicle, a digital photo stand for demonstrating high definition photos, digital pendants and electrical displays for store-front advertisement of a shape suited for the goods being advertised.

The disclosures of the aforementioned Patent Documents and the Non-Patent Documents are to be incorporated herein by reference. The various exemplary embodiments disclosed herein may be changed or adapted within the framework of the entire disclosure of the present invention, based on the basic technical concept of the invention. A large variety of combinations and selections of the disclosures of the present invention may be made within the scope of the invention as defined in the claims. That is, it should be stressed that the present invention comprises various changes or adaptations that may be made by those skilled in the art without departing from the spirit and the scope of the present invention.

What is claimed is:

1. A display apparatus comprising:
   an active matrix display section including: a plurality of signal lines and a plurality of scan lines, arrayed in a matrix form on a substrate; and a plurality of active elements and pixels, arranged at intersections of the signal lines and the scan lines;
   a scan line driving circuit that is provided on the substrate and that drives the scan lines; and
   a signal line driving circuit that is provided on the substrate and that drives the signal lines; wherein
   the display section has a non-rectangular shape, the substrate being analogous in shape with the display section; and wherein
   at least one of the scan line driving circuit and the signal line driving circuit includes a plurality of active elements having the same configuration as the active elements constituting the active matrix;
   at least one of the scan line driving circuit and the signal line driving circuit including:
   a plurality of circuit units having the same function;
   the circuit units being arranged along an outer circumference of the non-rectangular display section, each at a substantially identical distance from each associated ones of respective active elements and pixels in the outer circumference, wherein the circuit units arranged along an outer circumference of the non-rectangular display section includes a trapezoid shaped circuit unit that comprises:
   a power supply line and a signal line, each provided in common to a plurality of the circuit units and arranged in parallel with the direction along one of upper and lower bases of the trapezoid, each laterally traversing through the trapezoid shaped circuit, the circuit units opposite to a curvilinear portion of the outer circumference of the non-rectangular display section, each having a layout of a trapezoid shape or an inverted trapezoid shape according to a curvature polarity of the curvilinear portion, with neighboring ones of the trapezoid shaped or inverted trapezoid shaped circuit units having oblique sides thereof made in contact, the circuit units opposite to the curvilinear portion of the outer circumference of the non-rectangular display section, being arranged at a substantially identical distance from the curvilinear portion of the outer circumference.

2. The display apparatus according to claim 1, wherein the active element includes a thin-film silicon layer;
the thin-film silicon layer of the active element constituting the active matrix has a thickness equal to the thickness of the thin film silicon layer of the active element of at least one of the scan line driving circuit and the signal line driving circuit.

3. The display apparatus according to claim 1, wherein the circuit unit in at least one of the scan line driving circuit and the signal line driving circuit is laid out in a rectangular or in a non-rectangular shape; and wherein
the circuit units are connected in a plurality of stages, there being among the circuit units connected in the plurality of stages, circuit units having non-constant distances between neighboring ones of the circuit units.

4. The display apparatus according to claim 1, wherein at least one of the scan line driving circuit and the signal line driving circuit lying adjacent to a linearly extended portion of a rim of the non-rectangular display section is made up of a semiconductor IC having a rectangular shape; and wherein
the driving circuit lying adjacent to a curvilinear portion of the rim of the non-rectangular display section has a non-rectangular shape conforming to and lying along the curvilinear portion of the rim and includes the active elements produced by the same process as that for producing the active elements in the active matrix display section.

5. The display apparatus according to claim 1, wherein the length of an outer circumference of the display section lying adjacent to the signal line driving circuit is made longer than the length thereof lying adjacent to the scan line driving circuit.

6. The display apparatus according to claim 1, wherein among the circuit units arrayed along the outer circumference of the display section, there are provided at least one circuit unit arranged with a step difference from a neighboring circuit unit to provide for a uniform distance between the circuit units and a rim of the display section.

7. The display apparatus according to claim 6, wherein the circuit unit includes a shift register;
a plurality of the shift registers cascade-connected, constitute the scan line driving circuit; and wherein
the signal delivered to an initial stage shift register is output responsive to a clock signal and sequentially propagated to subsequent stage shift registers, while driving associated scan lines.

8. The display apparatus according to claim 1, wherein in at least a region in the display section, the circuit units are arranged at a constant spacing from each other relative to a direction parallel to an optionally selected linear axis.

9. The display apparatus according to claim 1, wherein among the circuit units arrayed along the outer circumference of the display section, there are provided at least one circuit unit tilted with respect to an other circuit unit in correspondence with a rim of the display section.

10. The display apparatus according to claim 1, wherein in at least a region of the display section, the circuit units are arranged at a preset angle relative to a direction extending along an optionally selected rotational axis.

11. The display apparatus according to claim 1, wherein the circuit units, arrayed along the outer circumference of the display section are of a rectangular layout shape.

12. The display apparatus according to claim 1, wherein the circuit units, arrayed along the outer circumference of the display section are of a trapezoidal or inverted trapezoidal layout shape.

13. The display apparatus according to claim 12, wherein neighboring ones of the circuit units, arrayed along the outer circumference of the display section, are at least ones selected from the group consisting of:
neighboring circuit units having a trapezoidal layout shape;
neighboring circuit units having an inverted trapezoidal layout shape; and
neighboring circuit units having a trapezoidal layout shape and an inverted trapezoidal layout shape, respectively.

14. The display apparatus according to claim 1, wherein among the circuit units, arranged along the outer circumference of the display section, there are provided one or more circuit units having a non-rectangular shape; and wherein
the one or more circuit units of a non-rectangular shape are assorted so that the array of the one or more circuit units of a non-rectangular shape becomes the densest arrangement.

15. The display apparatus according to claim 1, wherein in at least one of the scan line driving circuit and the signal line driving circuit, the layout size of the circuit unit is made smaller than an area delimited by two neighboring ones of the scan lines and by two neighboring ones of the signal lines.

16. A display apparatus comprising:
an active matrix display section including: a plurality of signal lines and a plurality of scan lines, arrayed in a matrix form on a substrate; and a plurality of active elements and pixels, arranged at intersections of the signal lines and the scan lines;
a scan line driving circuit that is provided on the substrate and that drives the scan lines; and
a signal line driving circuit that is provided on the substrate and that drives the signal lines; wherein
the display section has a non-rectangular shape, the substrate being analogous in shape with the display section; and wherein
at least one of the scan line driving circuit and the signal line driving circuit includes a plurality of active elements having the same configuration as the active elements constituting the active matrix;
at least one of the scan line driving circuit and the signal line driving circuit including:
a plurality of circuit units having the same function;
the circuit units being repeatedly translated and duplicated not only along a direction parallel to the scan lines but also a direction perpendicular to the scan lines to be arranged along an outer circumference of the non-rectangular display section, each at a substantially identical distance from each associated ones of respective active elements and pixels in the outer circumference, wherein the circuit unit includes, a power supply line and a signal line, each provided in common to a plurality of the circuit units, each laterally traversing through the circuit unit, in a connection area arranged between neighboring ones of the circuit units to connect the voltage power supply line and the signal line between the neighboring circuit units, at least one of the voltage power supply line and the signal line from one of the neighboring circuit units being elongated along a direction different from the lateral direction and connected to the corresponding at least one of the voltage power supply line and the signal line of the other of the neighboring circuit units.

* * * * *